United States Patent
Masuda

(10) Patent No.: US 12,452,994 B2
(45) Date of Patent: Oct. 21, 2025

(54) STRUCTURE, METHOD FOR MANUFACTURING STRUCTURE, AND COMPOSITION

(71) Applicant: FUJIFILM Corporation, Tokyo (JP)

(72) Inventor: Seiya Masuda, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 209 days.

(21) Appl. No.: 18/475,386

(22) Filed: Sep. 27, 2023

(65) Prior Publication Data
US 2024/0032186 A1 Jan. 25, 2024

Related U.S. Application Data

(63) Continuation of application No. PCT/JP2022/013434, filed on Mar. 23, 2022.

(30) Foreign Application Priority Data

Mar. 31, 2021 (JP) ................ 2021-059125

(51) Int. Cl.
*H05K 1/02* (2006.01)
*H03H 7/42* (2006.01)
(Continued)

(52) U.S. Cl.
CPC ........... *H05K 1/0216* (2013.01); *H03H 7/425* (2013.01); *H05K 1/181* (2013.01); *H05K 3/00* (2013.01)

(58) Field of Classification Search
CPC ........... H05K 1/0216; H05K 2201/083; H05K 2201/086; H05K 1/165
See application file for complete search history.

(56) References Cited

U.S. PATENT DOCUMENTS 10,508,189 B2   12/2019   Park et al.
2006/0166041 A1   7/2006   Takeda et al.
(Continued)

FOREIGN PATENT DOCUMENTS

CN      101652247 A   2/2010
JP      2003-193103 A   7/2003
(Continued)

OTHER PUBLICATIONS

International Search Report issued Jun. 21, 2022 in International Application No. PCT/JP2022/013434.
(Continued)

*Primary Examiner* — Sherman Ng
(74) *Attorney, Agent, or Firm* — Sughrue Mion, PLLC

(57) ABSTRACT

Provided are a structure having excellent shielding performance against electromagnetic waves in a frequency band of several tens of GHz, and a composition. Further, provided is a method for manufacturing a structure which makes it possible to easily manufacture a structure having excellent shielding performance against electromagnetic waves in a frequency band of several tens of GHz. The structure includes a substrate, a plurality of passive elements disposed on the substrate, and an electromagnetic wave absorbing film positioned at least in a region between the plurality of passive elements disposed on the substrate. The passive element is selected from the group consisting of an inductor and a balun. The electromagnetic wave absorbing film contains magnetic particles. In a case where a real part of a complex relative magnetic permeability μ of the electromagnetic wave absorbing film is defined as μ' and a complex part of the complex relative magnetic permeability μ of the electromagnetic wave absorbing film is defined as μ", the complex part μ" of the complex relative magnetic permeability μ of the electromagnetic wave absorbing film satisfies (Continued)

any one of requirements 1 to 3. Requirement 1: µ" at a frequency of 28 GHz is 0.1 to 10, Requirement 2: µ" at a frequency of 47 GHz is 0.1 to 5, and Requirement 3: µ" at a frequency of 60 GHz is 0.1 to 2.

20 Claims, 9 Drawing Sheets

(51) Int. Cl.
*H05K 1/18* (2006.01)
*H05K 3/00* (2006.01)

(56) References Cited

U.S. PATENT DOCUMENTS

| | | |
|---|---|---|
| 2009/0035452 A1 | 2/2009 | Kusano et al. |
| 2009/0051606 A1* | 2/2009 | Ochi .................. H05K 1/16 343/702 |
| 2010/0113264 A1 | 5/2010 | Tsurumi et al. |
| 2012/0268226 A1* | 10/2012 | Nakamura ............. C22C 38/10 335/302 |
| 2013/0236655 A1 | 9/2013 | Nasu et al. |
| 2014/0017876 A1 | 1/2014 | Barth et al. |
| 2016/0211071 A1 | 7/2016 | Jeong |
| 2017/0263370 A1 | 9/2017 | Park et al. |
| 2021/0043367 A1 | 2/2021 | Yoshioka et al. |

FOREIGN PATENT DOCUMENTS

| | | |
|---|---|---|
| TW | 200610484 A | 3/2006 |
| TW | 201630526 A | 8/2016 |
| WO | 2013/018253 A1 | 2/2013 |

OTHER PUBLICATIONS

Written Opinion issued Jun. 21, 2022 in International Application No. PCT/JP2022/013434.
International Preliminary Report on Patentability dated Oct. 3, 2023 with a Translation of the Written Opinion of the International Searching Authority in Application No. PCT/JP2022/013434.
Extended European Search Report issued Sep. 5, 2024 in European Application No. 22780368.1.
Communication dated Aug. 25, 2025 issued by the Taiwanese Patent Office in application No. 111111847.

* cited by examiner

STRUCTURE, METHOD FOR MANUFACTURING STRUCTURE, AND COMPOSITION

CROSS-REFERENCE TO RELATED APPLICATIONS

This application is a Continuation of PCT International Application No. PCT/JP2022/013434 filed on Mar. 23, 2022, which claims priority under 35 U.S.C. § 119(a) to Japanese Patent Application No. 2021-059125 filed on Mar. 31, 2021. The above applications are hereby expressly incorporated by reference, in their entirety, into the present application.

BACKGROUND OF THE INVENTION

1. Field of the Invention

The present invention relates to a structure having an electromagnetic wave shielding function, a method for manufacturing a structure, and a composition used for manufacturing a structure.

2. Description of the Related Art

Currently, there are various communication systems using wireless technology, for example, a mobile communication terminal such as a mobile phone, a smartphone, or a tablet, Internet communication, wireless fidelity (WiFi), Bluetooth (registered trademark), and global positioning system (GPS).

In order to support various communication systems, an antenna that can transmit and receive radio waves used in each communication system, a passive element that converts radio waves received by the antenna into current, voltage, or the like, a semiconductor element that creates a transmission signal to be transmitted from the antenna, and the like are required.

In addition, a mounting density of a passive element, a semiconductor element, an antenna, and the like is increasing due to the recent multi-functionalization and miniaturization of a mobile communication terminal and the miniaturization of a wireless communication module disposed at a communication access point or the like. For this reason, in the mobile communication terminal and the wireless communication module, for example, an electromagnetic wave generated in association with the operation of the passive element may affect other passive elements and the like, thereby hindering the normal operation of the passive elements. Therefore, the electromagnetic wave has been shielded in the related art.

For example, in US2014/0017876A, the form of a system-on-chip is provided with a conductivity gauge that protects a digital circuit or the like from electromagnetic radiation generated from a high frequency circuit disposed on a substrate. The conductivity gauge is disposed around the high frequency circuit. In addition, it is described that the conductivity gauge is composed of a metal such as copper, aluminum, gold, silver, platinum or tungsten, or an alloy.

SUMMARY OF THE INVENTION

In US2014/0017876A, the conductivity gauge that protects a digital circuit or the like from electromagnetic radiation is composed of a metal or an alloy. For this reason, sufficient shielding performance against electromagnetic waves in a frequency band of several tens of GHz cannot be obtained.

An object of the present invention is to provide a structure having excellent shielding performance against electromagnetic waves in a frequency band of several tens of GHz, and a composition.

Another object of the present invention is to provide a method for manufacturing a structure which makes it possible to easily manufacture a structure having excellent shielding performance against electromagnetic waves in a frequency band of several tens of GHz.

The above-mentioned objects can be achieved by the following configurations.

One aspect of the present invention provides a structure including a substrate, a plurality of passive elements disposed on the substrate, and an electromagnetic wave absorbing film positioned at least in a region on the substrate between the passive elements facing each other among the plurality of passive elements disposed on the substrate, in which the passive element is selected from the group consisting of an inductor and a balun, the electromagnetic wave absorbing film contains magnetic particles, and in a case where a real part of a complex relative magnetic permeability $\mu$ of the electromagnetic wave absorbing film is defined as $\mu'$ and a complex part of the complex relative magnetic permeability $\mu$ of the electromagnetic wave absorbing film is defined as $\mu''$, the complex part $\mu''$ of the complex relative magnetic permeability $\mu$ of the electromagnetic wave absorbing film satisfies any one of requirements 1 to 3.

Requirement 1: $\mu''$ at a frequency of 28 GHz is 0.1 to 10
Requirement 2: $\mu''$ at a frequency of 47 GHz is 0.1 to 5
Requirement 3: $\mu''$ at a frequency of 60 GHz is 0.1 to 2

One aspect of the present invention provides a structure including a substrate, a plurality of coiled passive elements disposed on the substrate and having opening portions that open to a surface of the substrate, and an electromagnetic wave absorbing film positioned in at least one opening portion among the opening portions of the plurality of coiled passive elements disposed on the substrate, in which the coiled passive element is selected from the group consisting of an inductor and a balun, the electromagnetic wave absorbing film contains magnetic particles, and in a case where a real part of a complex relative magnetic permeability $\mu$ of the electromagnetic wave absorbing film is defined as $\mu'$ and a complex part of the complex relative magnetic permeability $\mu$ of the electromagnetic wave absorbing film is defined as $\mu''$, the complex part $\mu''$ of the complex relative magnetic permeability $\mu$ of the electromagnetic wave absorbing film satisfies any one of requirements 1 to 3.

Requirement 1: $\mu''$ at a frequency of 28 GHz is 0.1 to 10
Requirement 2: $\mu''$ at a frequency of 47 GHz is 0.1 to 5
Requirement 3: $\mu''$ at a frequency of 60 GHz is 0.1 to 2

One aspect of the present invention provides a structure including a substrate, a plurality of passive elements disposed on the substrate, and an electromagnetic wave absorbing film provided at least one of between the substrate and the passive element or on an opposite side of the substrate of the passive element, in which the passive element is selected from the group consisting of an inductor and a balun, the electromagnetic wave absorbing film contains magnetic particles, and in a case where a real part of a complex relative magnetic permeability $\mu$ of the electromagnetic wave absorbing film is defined as $\mu'$ and a complex part of the complex relative magnetic permeability $\mu$ of the electromagnetic wave absorbing film is defined as $\mu''$, the complex part $\mu''$ of the complex relative magnetic permeability μ of the electromagnetic wave absorbing film satisfies any one of requirements 1 to 3.

Requirement 1: $\mu''$ at a frequency of 28 GHz is 0.1 to 10
Requirement 2: $\mu''$ at a frequency of 47 GHz is 0.1 to 5
Requirement 3: $\mu''$ at a frequency of 60 GHz is 0.1 to 2

It is preferable that the electromagnetic wave absorbing film is provided in a region on the substrate between the plurality of coiled passive elements disposed on the substrate.

It is preferable that the electromagnetic wave absorbing film is provided between the substrate and the passive element and on the opposite side of the substrate 20 of the passive element.

It is preferable that the magnetic particles contain at least one metal element of Ni, Co, or Fe and have an average primary particle diameter of 20 to 1,000 nm.

It is preferable that the electromagnetic wave absorbing film has a thickness of 300 μm or less.

One aspect of the present invention provides a method for manufacturing a structure, including a step of forming a composition layer by applying a photosensitive composition containing magnetic particles onto a substrate on which a plurality of passive elements are disposed, and a step of subjecting the composition layer to an exposure treatment and a development treatment to form an electromagnetic wave absorbing film positioned at least in a region between the passive elements facing each other among the plurality of passive elements disposed on the substrate, in which the passive element is selected from the group consisting of an inductor and a balun, and in a case where a real part of a complex relative magnetic permeability μ of the electromagnetic wave absorbing film is defined as $\mu'$ and a complex part of the complex relative magnetic permeability μ of the electromagnetic wave absorbing film is defined as $\mu''$, the complex part $\mu''$ of the complex relative magnetic permeability μ of the electromagnetic wave absorbing film satisfies any one of requirements 1 to 3.

Requirement 1: $\mu''$ at a frequency of 28 GHz is 0.1 to 10
Requirement 2: $\mu''$ at a frequency of 47 GHz is 0.1 to 5
Requirement 3: $\mu''$ at a frequency of 60 GHz is 0.1 to 2

One aspect of the present invention provides a method for manufacturing a structure, including a step of forming a composition layer by applying a photosensitive composition containing magnetic particles onto at least one opening portion of a plurality of coiled passive elements disposed on a substrate and having opening portions that open to a surface of the substrate, and a step of subjecting the composition layer to an exposure treatment and a development treatment to form an electromagnetic wave absorbing film positioned in at least one opening portion among the opening portions of the plurality of coiled passive elements disposed on the substrate, in which the coiled passive element is selected from the group consisting of an inductor and a balun, and in a case where a real part of a complex relative magnetic permeability μ of the electromagnetic wave absorbing film is defined as $\mu'$ and a complex part of the complex relative magnetic permeability μ of the electromagnetic wave absorbing film is defined as $\mu''$, the complex part $\mu''$ of the complex relative magnetic permeability μ of the electromagnetic wave absorbing film satisfies any one of requirements 1 to 3.

Requirement 1: $\mu''$ at a frequency of 28 GHz is 0.1 to 10
Requirement 2: $\mu''$ at a frequency of 47 GHz is 0.1 to 5
Requirement 3: $\mu''$ at a frequency of 60 GHz is 0.1 to 2

One aspect of the present invention provides a method for manufacturing a structure, including a step of forming a composition layer by applying a photosensitive composition containing magnetic particles onto a substrate, a step of subjecting the composition layer to an exposure treatment and a development treatment to form an electromagnetic wave absorbing film on the substrate, and a step of forming a plurality of passive elements on the electromagnetic wave absorbing film, in which the passive element is selected from the group consisting of an inductor and a balun, and in a case where a real part of a complex relative magnetic permeability μ of the electromagnetic wave absorbing film is defined as $\mu'$ and a complex part of the complex relative magnetic permeability μ of the electromagnetic wave absorbing film is defined as $\mu''$, the complex part $\mu''$ of the complex relative magnetic permeability μ of the electromagnetic wave absorbing film satisfies any one of requirements 1 to 3.

Requirement 1: $\mu''$ at a frequency of 28 GHz is 0.1 to 10
Requirement 2: $\mu''$ at a frequency of 47 GHz is 0.1 to 5
Requirement 3: $\mu''$ at a frequency of 60 GHz is 0.1 to 2

One aspect of the present invention provides a method for manufacturing a structure, including a step of forming a composition layer by applying a photosensitive composition containing magnetic particles onto a substrate on which a plurality of passive elements are disposed, and a step of subjecting the composition layer to an exposure treatment and a development treatment to form an electromagnetic wave absorbing film on the plurality of passive elements, in which the passive element is selected from the group consisting of an inductor and a balun, and in a case where a real part of a complex relative magnetic permeability μ of the electromagnetic wave absorbing film is defined as $\mu'$ and a complex part of the complex relative magnetic permeability μ of the electromagnetic wave absorbing film is defined as $\mu''$, the complex part $\mu''$ of the complex relative magnetic permeability μ of the electromagnetic wave absorbing film satisfies any one of requirements 1 to 3.

Requirement 1: $\mu''$ at a frequency of 28 GHz is 0.1 to 10
Requirement 2: $\mu''$ at a frequency of 47 GHz is 0.1 to 5
Requirement 3: $\mu''$ at a frequency of 60 GHz is 0.1 to 2

It is preferable that the step of forming a composition layer includes a step of applying the photosensitive composition onto the opening portions of the plurality of coiled passive elements and the substrate on which the plurality of coiled passive elements are disposed, and the step of forming an electromagnetic wave absorbing film is a step of forming the electromagnetic wave absorbing film in the opening portions of the plurality of coiled passive elements disposed on the substrate and in a region on the substrate between the plurality of coiled passive elements.

Further, it is preferable to have a step of forming a composition layer by applying the photosensitive composition onto the electromagnetic wave absorbing film on which the plurality of passive elements have been formed, and a step of subjecting the composition layer to an exposure treatment and a development treatment to further form an electromagnetic wave absorbing film on the electromagnetic wave absorbing film on which the plurality of passive elements have been formed.

One aspect of the present invention provides a composition for use in forming an electromagnetic wave absorbing film in the structure, which includes magnetic particles, a resin having an acid group, a curable compound, and a polymerization initiator, in which, in a case where a real part of a complex relative magnetic permeability μ of an electromagnetic wave absorbing film formed of the composition is defined as $\mu'$ and a complex part of the complex relative magnetic permeability μ of the electromagnetic wave absorbing film is defined as $\mu''$, the complex part $\mu''$ of the complex relative magnetic permeability μ of the electromagnetic wave absorbing film satisfies any one of requirements 1 to 3.

Requirement 1: μ" at a frequency of 28 GHz is 0.1 to 10
Requirement 2: μ" at a frequency of 47 GHz is 0.1 to 5
Requirement 3: μ" at a frequency of 60 GHz is 0.1 to 2

It is preferable that the magnetic particles contain at least one metal element of Ni, Co, or Fe and have an average primary particle diameter of 20 to 1,000 nm.

According to an aspect of the present invention, it is possible to provide a structure having excellent shielding performance against electromagnetic waves in a frequency band of several tens of GHz, and a composition.

According to another aspect of the present invention, it is possible to provide a method for manufacturing a structure which makes it possible to easily manufacture a structure having excellent shielding performance against electromagnetic waves in a frequency band of several tens of GHz.

DESCRIPTION OF THE PREFERRED EMBODIMENTS

Hereinafter, a structure, a method for manufacturing a structure, and a composition according to the embodiment of the present invention will be described in detail with reference to suitable embodiments shown in the accompanying drawings.

It should be noted that the drawings described below are only exemplary for illustrating the present invention, and the present invention is not limited to the drawings shown below.

In addition, the drawings described below are drawings in which an inductor portion and a magnetic portion of an actual device are emphasized, and the illustration of an electric circuit, a copper wire, a waveguide, and the like around the inductor is omitted.

In the following, the expression "to" indicating a numerical range includes numerical values described on both sides of "to". For example, in a case where ε is a numerical value $\varepsilon_\alpha$ to a numerical value $\varepsilon_\beta$, the range of ε is a range including the numerical value $\varepsilon_\alpha$ and the numerical value $\varepsilon_\beta$ and is represented by $\varepsilon_\alpha \leq \varepsilon \leq \varepsilon_\beta$ in mathematical symbols.

Unless otherwise specified, the angle includes an error range generally acceptable in the relevant technical field.

[First Example of Structure]

Figure 1:
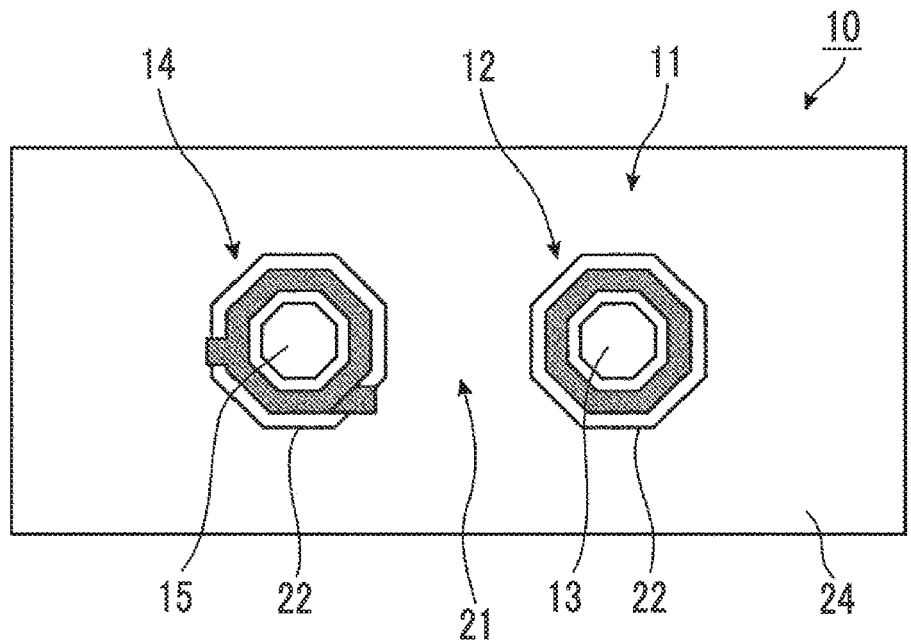
FIG. 1 is a schematic plan view showing a first example of a structure according to an embodiment of the present invention.
Figure 2:
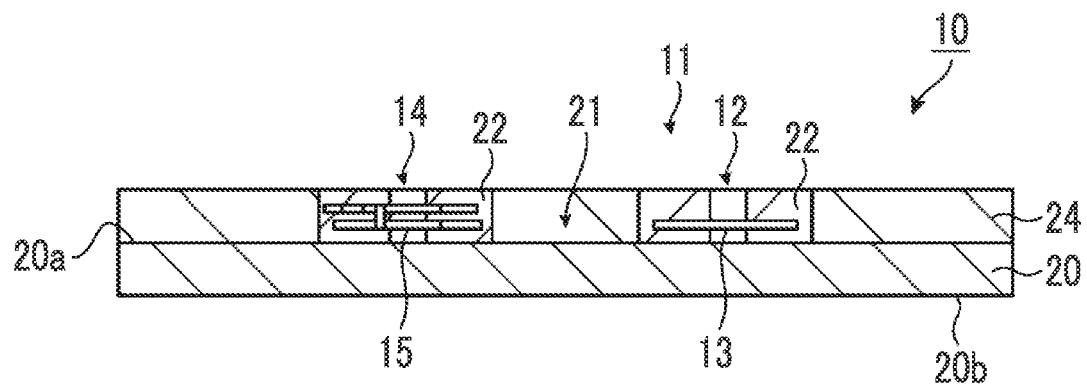
FIG. 2 is a schematic cross-sectional view showing the first example of the structure according to the embodiment of the present invention.

FIG. 1 is a schematic plan view showing a first example of a structure according to an embodiment of the present invention, and FIG. 2 is a schematic cross-sectional view showing the first example of the structure according to the embodiment of the present invention.

A structure 10 includes a substrate 20, a plurality of passive elements 11 disposed on the substrate 20, and an electromagnetic wave absorbing film 24 positioned at least in a region 21 on the substrate 20 between the passive elements 11 facing each other among the plurality of passive elements 11 disposed on the substrate 20. In FIG. 1, the electromagnetic wave absorbing film 24 is disposed on a surface 20a of the substrate 20 to surround the passive element 11.

The plurality of passive elements 11 are electrically connected to each other.

As shown in FIG. 2, the structure 10 is provided with, for example, two interlayer insulating films 22 spaced apart from each other on the substrate 20, and one passive element 11 is provided on each interlayer insulating film 22. The electromagnetic wave absorbing film 24 is provided on the surface 20a of the substrate 20 to surround the passive element 11.

The passive element 11 is selected from the group consisting of an inductor and a balun. The balun of the present invention is a balun transformer which will be described later. The passive element 11 shown in FIG. 1 is, for example, an inductor 12 and an inductor 14.

The fact that the passive elements 11 are disposed spaced apart from each other on the substrate 20 is a form in which, for example, the inductor 12 and the inductor 14 are provided as a plurality of passive elements 11 on the same surface of the substrate 20, and is not a form in which the inductor 12 is provided on a surface 20a of the substrate 20, and the inductor 14 is provided on a rear surface 20b of the substrate 20. A case where the substrate 20 has a step, a case where the substrate 20 is bent, or a case where another layer such as an insulating film is included between the substrate 20 and the passive element 11 is also regarded as the same surface.

In addition, the electromagnetic wave absorbing film 24 may be positioned at least in a region 21 on the substrate 20 between the passive elements 11. The region 21 on the substrate 20 between the passive elements 11 is a space on the side where the inductor 12 and the inductor 14 face each other, for example, in a case where the inductor 12 and the inductor 14 are disposed spaced apart to face each other.

Figure 3:
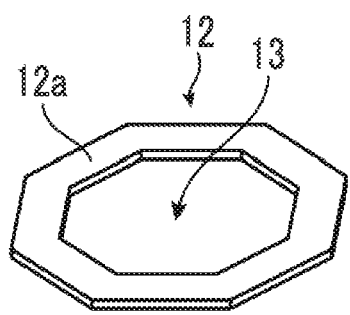
FIG. 3 is a schematic perspective view showing an example of an inductor of the first example of the structure according to the embodiment of the present invention.

The inductor 12 is, for example, a coil as shown in FIG. 3, and is composed of a single strip-shaped member 12a. The inductor 12 has a circular outer shape or a polygonal outer shape such as an octagonal shape. The inductor 12 has an opening portion 13 that opens to the surface 20a of the substrate 20. The opening portion 13 of the inductor 12 is a region surrounded by the strip-shaped member 12a.

The inductor 12 is a passive element that operates in the vicinity of a self-resonance frequency, through which a large amount of current flows at the self-resonance frequency, and serves to extract a signal having a specific frequency. The self-resonance frequency is, for example, 60 GHz.

For example, an electromagnetic wave used in the communication standard fifth generation (5G) using a frequency band of 28 GHz to 80 GHz is used for the inductor.

The inductor is composed of, for example, copper. In addition, the thickness of the inductor is, for example, 0.1 to 500 μm.

Figure 4:
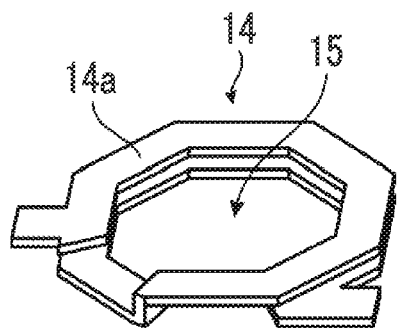
FIG. 4 is a schematic perspective view showing an example of an inductor of the first example of the structure according to the embodiment of the present invention.

The inductor 14 is, for example, a coil as shown in FIG. 4, and is composed of, for example, a strip-shaped member 14a having a predetermined number of turns. The inductor 14 has a circular outer shape or a polygonal outer shape such as an octagonal shape, like the inductor 12. The inductor 14 has an opening portion 15 that opens to the surface 20a of the substrate 20. The opening portion 15 of the inductor 14 is a region surrounded by the strip-shaped member 14a.

The size, number of turns, and the like of the inductor 14 are determined by the resonance frequency. For example, in a case where the resonance frequency is 60 GHz, the outer diameter is 100 μm, the width of the strip-shaped member 14a is 15 μm, the thickness of the strip-shaped member 14a is 2 μm, and the number of turns is 1.75.

The coil represented by the inductor 12 and the coil represented by the inductor 14 can be used individually as inductors, or two coils can be stacked and used as a balun transformer. The thickness of the coil represented by the inductor 12 and the thickness of the coil represented by the inductor 14 may be different.

The balun transformer (not shown) is a stack structure of coils vertically such that, for example, coils in the form of the inductor 12 or inductor 14 are spaced apart by a certain distance, for example, 10 μm to 300 μm in a vertical direction perpendicular to the surface 20a of the substrate 20, and the centers of the two coils coincide. The balun transformer is an element that converts or modulates a high-frequency signal of several tens of GHz input to one coil into the other coil.

The balun transformer aligns the waves of the input high-frequency signal of several tens of GHz or inverts the waves of the high-frequency signal. In addition, the balun transformer is an element for converting an electric signal in a balanced state and an unbalanced state.

For example, the balun transformer is composed of copper. The thickness of the coils of the balun transformer may be different, and is, for example, 0.1 to 500 μm.

In a case where a high-frequency signal in a frequency band of several tens of GHz is input to each of the coils of the inductor 12 and the inductor 14, a high-frequency wave in a frequency band of several tens of GHz is generated to generate an electromagnetic field. For example, in a case where an electromagnetic field is generated due to the high-frequency wave generated in the inductor 14, the inductor 12 may be affected unless the electromagnetic field is shielded by the electromagnetic wave absorbing film 24.

The inductor 12 and the inductor 14, and the balun transformer are also referred to as coiled passive elements.

The substrate 20 is composed of, for example, Si, polyimide, or $SiO_2$. The interlayer insulating film 22 is composed of, for example, $SiO_2$. In addition, the substrate 20 and the interlayer insulating film 22 are also composed of a glass epoxy resin such as Flame Retardant (FR)-4, polytetrafluoroethylene (PTFE), or the like.

The inductor 12 and the inductor 14, and the balun transformer are composed of copper (Cu).

The interlayer insulating film 22 is different from the electromagnetic wave absorbing film 24. In a case where a real part of a complex relative magnetic permeability μ of the interlayer insulating film 22 is defined as μ' and a complex part of the complex relative magnetic permeability μ of the interlayer insulating film 22 is defined as μ", the complex part μ" of the complex relative magnetic permeability μ of the interlayer insulating film 22 does not satisfy the following requirements 1 to 3. The interlayer insulating film 22 has, for example, a real part μ' of 1 and a complex part μ" of zero.

Requirement 1: μ" at a frequency of 28 GHz is 0.1 to 10
Requirement 2: μ" at a frequency of 47 GHz is 0.1 to 5
Requirement 3: μ" at a frequency of 60 GHz is 0.1 to 2

The structure 10 is used, for example, in an antenna-in-package, and is provided with, for example, an array antenna, an analog/digital (A/D) circuit, a memory, and an application specific integrated circuit (ASIC), although not shown, in addition to the passive elements 11 of the inductor 12 and the inductor 14, and the balun transformer (not shown) described above. The A/D circuit, the memory, and the ASIC are composed of, for example, various semiconductor elements.

In addition, the structure 10 has, in addition to the above-mentioned configuration, various circuits, elements, and the like that a mobile communication terminal such as a smartphone or a wireless communication module has, for example, a radio frequency (RF) circuit, a power amplifier for transmission, a low noise amplifier for reception, an integrated passive element, a switch, or a phase shifter.

The substrate 20 functions as a support for the structure 10, and the above-mentioned passive element 11 is disposed on the substrate 20. In addition, the electromagnetic wave absorbing film 24 is disposed on the substrate 20. In addition, the A/D circuit, the memory, the ASIC, and the like constituting the above-mentioned antenna-in-package may be disposed on the substrate 20.

The interlayer insulating film 22, on which the inductor 12 and the inductor 14, and the balun transformer are formed, electrically insulates the inductor 12 and the inductor 14, and the balun transformer.

The interlayer insulating film 22 is not particularly limited as long as it can electrically insulate the inductor 12 and the inductor 14, and the balun transformer, and various types of films used for the formation of a semiconductor element or the like can be used.

The electromagnetic wave absorbing film 24 absorbs electromagnetic waves radiated from the inductor 12 or the inductor 14, and the balun transformer. The electromagnetic wave absorbing film 24 shields the electromagnetic waves radiated from one of the inductor 12 and the inductor 14, and the balun transformer, thereby making it possible to suppress the influence of the electromagnetic waves on the other of the inductor 12 and the inductor 14, and the balun transformer. This suppresses the normal operation of the passive element from being disturbed.

The electromagnetic wave absorbing film 24 contains magnetic particles. In a case where a real part of a complex relative magnetic permeability $\mu$ of the electromagnetic wave absorbing film is defined as $\mu'$ and a complex part of the complex relative magnetic permeability $\mu$ of the electromagnetic wave absorbing film is defined as $\mu''$, the complex part $\mu''$ of the complex relative magnetic permeability $\mu$ of the electromagnetic wave absorbing film satisfies any one of the following requirements 1 to 3.

Requirement 1: $\mu''$ at a frequency of 28 GHz is 0.1 to 10
Requirement 2: $\mu''$ at a frequency of 47 GHz is 0.1 to 5
Requirement 3: $\mu''$ at a frequency of 60 GHz is 0.1 to 2

Due to the magnetic particles, the electromagnetic wave absorbing film 24 exhibits sufficient shielding performance against electromagnetic waves in a frequency band of several tens of GHz. The magnetic particles will be described later.

Preferred ranges of the requirements 1 to 3 are as follows.
Requirement 1: $\mu''$ at a frequency of 28 GHz is 0.7 to 10
Requirement 2: $\mu''$ at a frequency of 47 GHz is 0.5 to 5
Requirement 3: $\mu''$ at a frequency of 60 GHz is 0.2 to 2

The real part $\mu'$ and the complex part $\mu''$ of the complex relative magnetic permeability $\mu$ of the electromagnetic wave absorbing film can be measured as follows.

A vector network analyzer (product name: N5225B) manufactured by Keysight Technologies, Inc. and a horn antenna (product name: RH12S23, RH06S10) manufactured by Keycom Corporation are used as measurement devices. Subsequently, the magnetic permeability ($\mu'$ and $\mu''$) at a frequency of 60 GHz is obtained by measuring an S parameter every 0.1 GHz according to a free space method by setting an incidence angle to 0° and a sweep frequency band to 55.0 GHz to 95.0 GHz, with one plane of each of the above-mentioned electromagnetic wave absorbing films being directed toward an incident side. The magnetic permeability ($\mu'$ and $\mu''$) at frequencies of 28 GHz and 47 GHz is obtained by changing the sweep frequency band. It should be noted that the complex part $\mu''$ of the complex relative magnetic permeability $\mu$ of the interlayer insulating film 22 can also be measured in the same manner as the real part $\mu'$ and the complex part $\mu''$ of the complex relative magnetic permeability $\mu$ of the electromagnetic wave absorbing film.

The magnetic permeability is a rate of change of a magnetic flux density (B) that occurs in a case where a magnetic field (H) is applied to a certain material, and is represented by the following expression.

$$\mu = B/H$$

In a case of a magnetic material, a larger amount of magnetic flux is passed through the inside of the magnetic material, but a material that is not the magnetic material exhibits no change in magnetic flux, so the value of the magnetic permeability is 1. The magnetic permeability is represented by the following expression. Here, j in the following expression represents an imaginary number.

$$\mu = \mu'(\text{real part}) - j \times \mu''(\text{imaginary part})$$

In a case where the direction of the current is reversed in a high-frequency wave such as an electromagnetic wave, the real part means the performance as a magnetic material that produces a higher magnetic flux density, whereas $\mu''$ of the imaginary part indicates an energy loss. Specifically, the magnetic moment of the crystal in the magnetic material tries to go toward the direction of the magnetic field generated by a high frequency wave, but in a case where the magnetic moment is reversed in an opposite direction, a delay in the reversal time or an energy loss (energy conversion into heat) occurs.

At a high-frequency wave, the change in the magnetic moment in the magnetic material cannot follow the change in the magnetic field of the electromagnetic field given from the outside, resulting in a significant energy loss. This effect is used for the absorption of electromagnetic waves.

In addition, the thickness of the electromagnetic wave absorbing film 24 is preferably 300 $\mu$m or less. In a case where the thickness of the electromagnetic wave absorbing film 24 is 300 $\mu$m or less, the electromagnetic wave shielding performance can be maintained and the height of the structure can be reduced.

The thickness of the electromagnetic wave absorbing film 24 is more preferably 10 to 200 $\mu$m, and the lower limit value of the thickness is 5 $\mu$m.

The array antenna constituting the antenna-in-package has, for example, four antennas. For example, the four antennas are all the same. The configurations of the array antenna and the antenna are not particularly limited and are appropriately determined according to a frequency band for transmission or reception, a polarization direction for reception, and the like. In addition, the array antenna has four antennas, but the present invention is not limited thereto. A single antenna may be used instead of the array antenna.

The A/D circuit converts an analog signal into a digital signal, and a known A-D converter is used. The A/D circuit converts the received signal received by the array antenna by radio waves into a digital signal.

The ASIC obtains the original data or signal transmitted to the array antenna from the received signal converted into a digital signal. In addition, the ASIC generates transmission data or a transmission signal in a state of a digital signal. The function of the ASIC is not particularly limited and is appropriately determined according to the intended use and the like.

In addition, the A/D circuit converts the transmission data or the transmission signal generated by the ASIC into an analog signal that can be transmitted by the array antenna.

The memory stores the transmission data or the transmission signal generated in the ASIC, the received signal converted into a digital signal received by the array antenna, and the like. For example, a volatile memory of a dynamic random access memory (DRAM) is used as the memory, and a high bandwidth memory (HBM) is preferable.

In addition, the electromagnetic wave absorbing film 24 suppresses electromagnetic interference of the A/D circuit, the memory, and the ASIC due to the electromagnetic waves emitted by the array antenna. As a result, the normal operation of the A/D circuit, the memory, and the ASIC is not hindered, and malfunctions thereof are also suppressed.

It is possible to enhance the directivity of an antenna output by controlling the absorption of electromagnetic waves by the electromagnetic wave absorbing film 24, and further, it is also possible to achieve high integration and higher performance of the structure by inserting a magnetic material as a structure inside the structure of a wafer level package.

[Method for Manufacturing First Example of Structure]

The method for manufacturing a first example of a structure includes a step of forming a composition layer by applying a photosensitive composition containing magnetic particles onto a substrate on which a plurality of passive elements are disposed, and a step of subjecting the composition layer to an exposure treatment and a development treatment to form an electromagnetic wave absorbing film positioned at least in a region between the plurality of passive elements disposed on the substrate.

As described above, the passive element is selected from the group consisting of an inductor and a balun. In a case where a real part of a complex relative magnetic permeability $\mu$ of the electromagnetic wave absorbing film is defined as $\mu'$ and a complex part of the complex relative magnetic permeability $\mu$ of the electromagnetic wave absorbing film is defined as $\mu''$, the complex part $\mu''$ of the complex relative magnetic permeability $\mu$ of the electromagnetic wave absorbing film satisfies any one of the following requirements 1 to 3.

Requirement 1: $\mu''$ at a frequency of 28 GHz is 0.1 to 10
Requirement 2: $\mu''$ at a frequency of 47 GHz is 0.1 to 5
Requirement 3: $\mu''$ at a frequency of 60 GHz is 0.1 to 2

Figure 5:
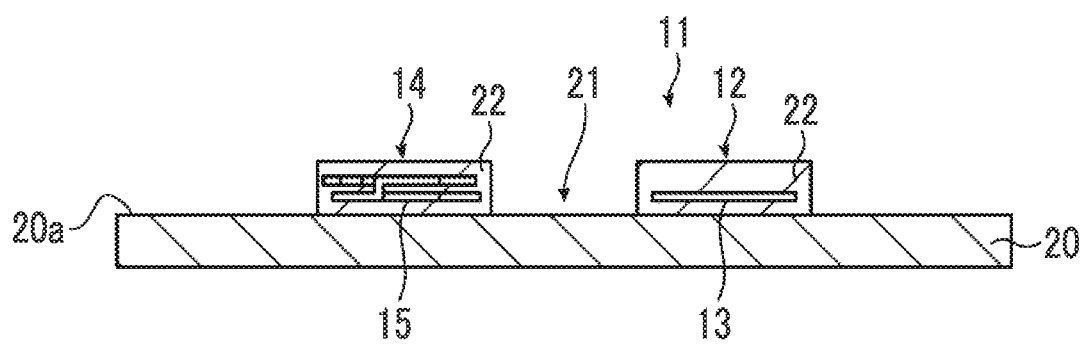
FIG. 5 is a schematic cross-sectional view showing an example of a method for manufacturing the first example of the structure according to the embodiment of the present invention.
Figure 6:
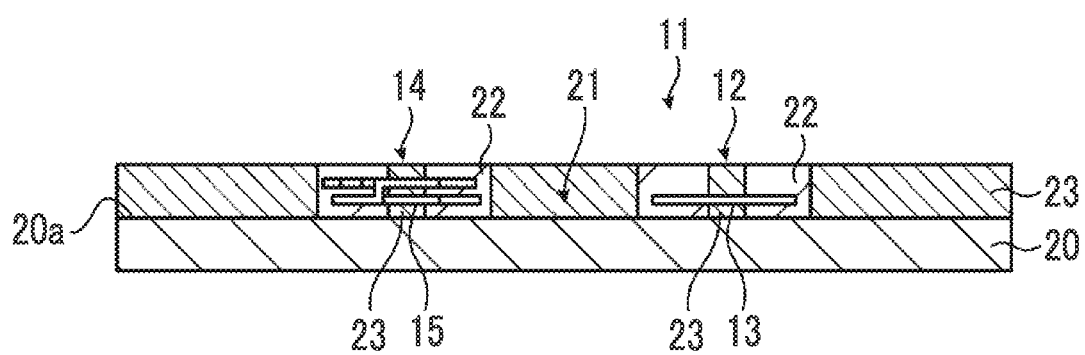
FIG. 6 is a schematic cross-sectional view showing an example of a method for manufacturing the first example of the structure according to the embodiment of the present invention.
Figure 7:
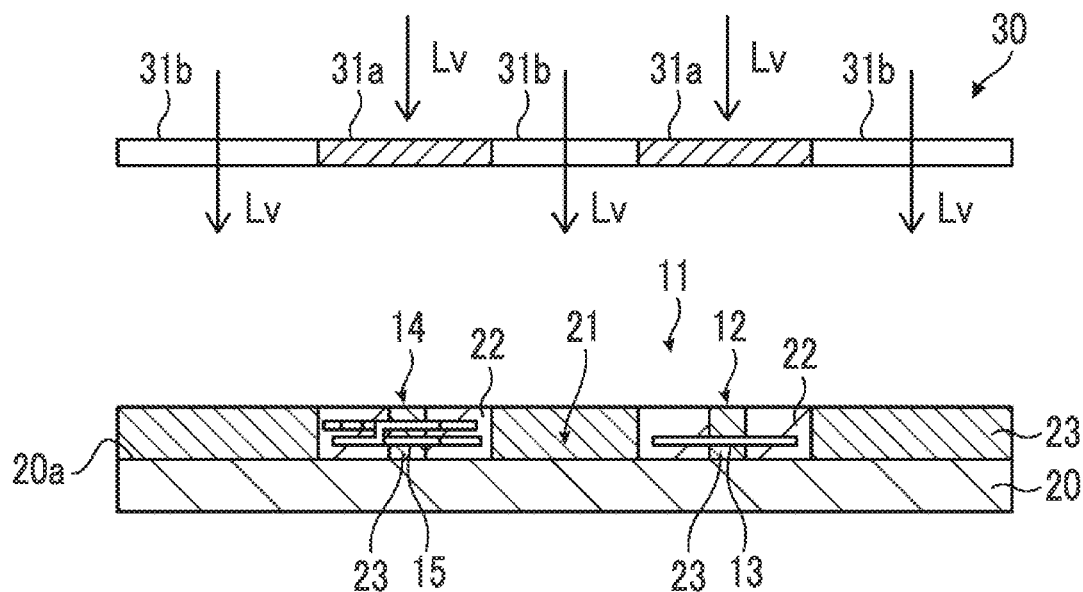
FIG. 7 is a schematic cross-sectional view showing an example of a method for manufacturing the first example of the structure according to the embodiment of the present invention.

Here, FIG. 5 to FIG. 7 are schematic cross-sectional views showing an example of the method for manufacturing the first example of the structure according to the embodiment of the present invention in the order of steps. In FIG. 5 to FIG. 7, the same components as those of the structure 10 shown in FIG. 1 and FIG. 2 are denoted by the same reference numerals, and the detailed description thereof will be omitted.

For example, as shown in FIG. 5, the structure is prepared in which, for example, the inductor 12 and the inductor 14 are provided spaced apart from each other on the surface 20*a* of the substrate 20. The inductor 12 and the inductor 14 are provided in the interlayer insulating film 22. The inductor 12 and the inductor 14 are formed, for example, by a device microfabrication technique in which steps such as lamination sputtering, physical vapor deposition (PVD), chemical vapor deposition (CVD), photolithography, dry etching, plasma ashing, copper electrolytic plating, chemical mechanical polishing (CMP) slurry polishing, and wet etching are combined a plurality of times. The balun transformer can also be formed in the same manner as the inductor 12 and the inductor 14.

Next, as shown in FIG. 6, the above-mentioned photosensitive composition containing magnetic particles is applied onto the entire surface of the surface 20*a* of the substrate 20 to form a composition layer 23. For example, the composition layer 23 is of a negative type, and a non-exposed portion is removed by a development treatment. The thickness of the composition layer 23 is not particularly limited, and it is sufficient that the thickness is 300 µm or less in a case of being formed into the electromagnetic wave absorbing film 24 as described later.

Next, a photo mask 30 is disposed on the composition layer 23 as shown in FIG. 7. The photo mask 30 is provided with, for example, a mask portion 31*a* in a region other than the region where the electromagnetic wave absorbing film 24 is formed. The exposure light Lv for exposing the composition layer 23 is transmitted through a region 31*b* other than the mask portion 31*a*. The mask portion 31*a* blocks the exposure light Lv.

The composition layer 23 exposed to light using the photo mask 30 is of a negative type as described above, and a non-exposed portion is removed by a development treatment. That is, the exposed portion of the composition layer 23 is the electromagnetic wave absorbing film 24. The composition layer 23 formed in the opening portion 13 of the inductor 12 and the opening portion 15 of the inductor 14 is removed because it is a non-exposed portion, and therefore the electromagnetic wave absorbing film 24 is not formed in the opening portion 13 of the inductor 12 and the opening portion 15 of the inductor 14.

In a case where the composition layer 23 is of a positive type, an exposed portion is removed by a development treatment, so the photo mask 30 has a light shielding region opposite to that of the photo mask 30 shown in FIG. 7.

The method of the development treatment is not particularly limited, and a known development treatment can be applied. Examples of the developer used in the development treatment include an alkali developer and a developer containing an organic solvent.

The photo mask 30 is disposed on the composition layer 23 which is then subjected to light exposure and a development treatment to form the electromagnetic wave absorbing film 24 (see FIG. 1). As a result, the structure 10 shown in FIG. 1 is obtained.

As described above, the electromagnetic wave absorbing film 24 (see FIG. 1) can be formed by the exposure treatment and the development treatment, which makes it possible to easily manufacture a structure having high integration and higher performance.

[Second Example of Structure]

Figure 8:
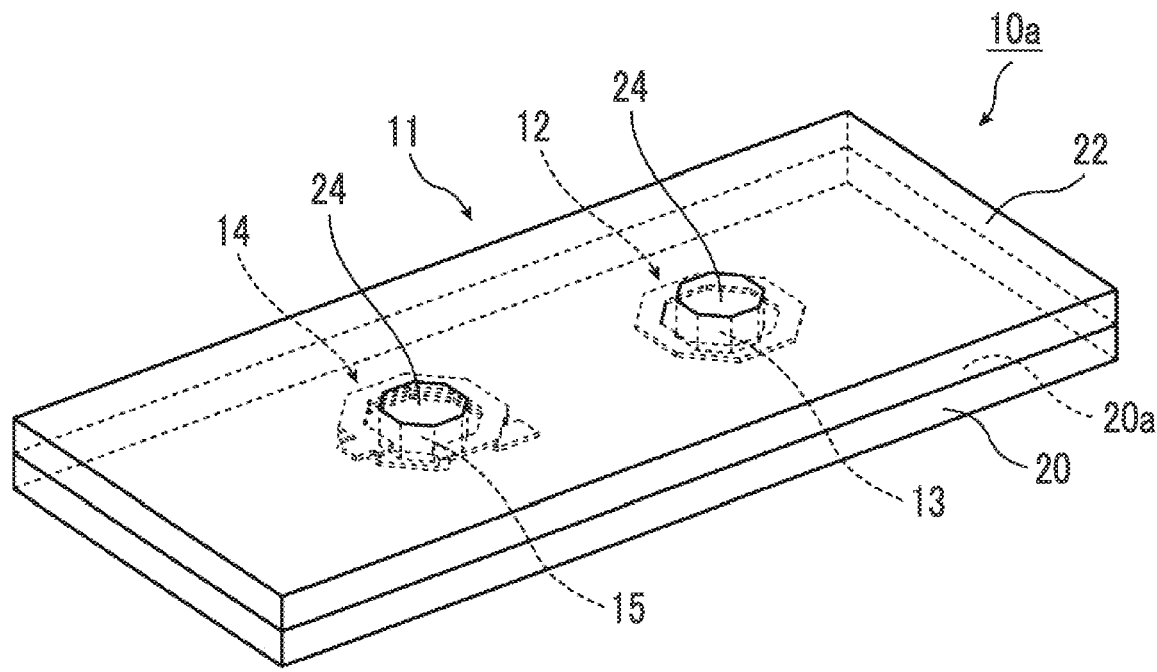
FIG. 8 is a schematic perspective view showing a second example of the structure according to the embodiment of the present invention.

FIG. 8 is a schematic perspective view showing a second example of the structure according to the embodiment of the present invention. In FIG. 8, the same components as those of the structure 10 shown in FIG. 1 and FIG. 2, the inductor 12 shown in FIG. 3, and the inductor 14 shown in FIG. 4 are denoted by the same reference numerals, and the detailed description thereof will be omitted.

In a structure 10*a* shown in FIG. 8, the position of the electromagnetic wave absorbing film 24 is different from that of the structure 10 shown in FIG. 1 and FIG. 2.

The structure 10*a* has the same configuration as the structure 10 shown in FIG. 1 and FIG. 2, except that the electromagnetic wave absorbing film 24 is disposed in the opening portion 13 of the inductor 12 and the opening portion 15 of the inductor 14, and the interlayer insulating film 22 is provided around the inductor 12 and the inductor 14 on the surface 20a of the substrate 20.

The same effect as that of the structure 10 shown in FIG. 1 and FIG. 2 can be obtained by providing the electromagnetic wave absorbing film 24 in the opening portion 13 of the inductor 12 and the opening portion 15 of the inductor 14. In addition, the structure 10a can make the electromagnetic wave absorbing film 24 smaller than the structure 10 shown in FIG. 1 and FIG. 2. Therefore, the amount of the above-mentioned photosensitive composition used for forming the electromagnetic wave absorbing film 24 can be reduced.

In the structure 10a of FIG. 8, the electromagnetic wave absorbing film 24 is provided in the opening portion 13 of the inductor 12 and the opening portion 15 of the inductor 14, but the electromagnetic wave absorbing film 24 may be provided in at least one of the opening portion 13 of the inductor 12 or the opening portion 15 of the inductor 14. In this case, it is preferable that the electromagnetic wave absorbing film 24 is provided on the side of the inductor 12 or the inductor 14 that generates a high-frequency wave.

In a case where the inductor 12, the inductor 14, or the balun transformer (not shown) is disposed as a plurality of coiled passive elements of 3 or more, unlike the above-mentioned configuration, the electromagnetic wave absorbing film 24 positioned in at least one opening portion of these coiled passive elements may be formed.

[Method for Manufacturing Second Example of Structure]

Figure 9:
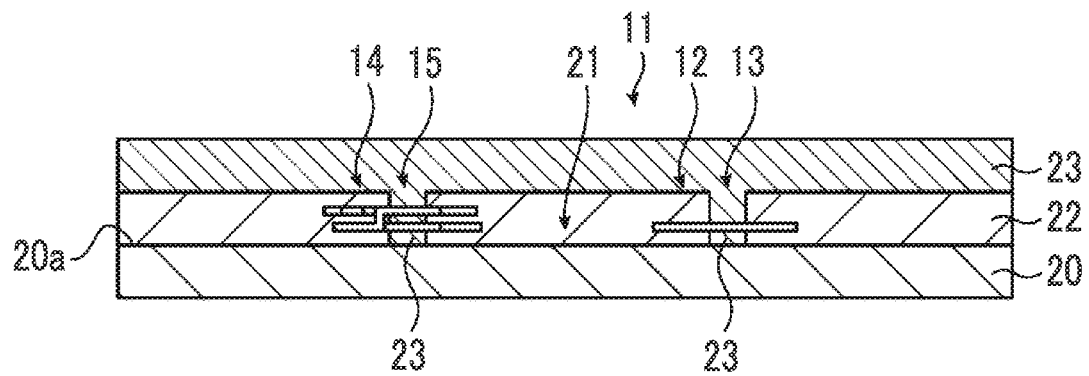
FIG. 9 is a schematic cross-sectional view showing an example of a method for manufacturing the second example of the structure according to the embodiment of the present invention.

FIG. 9 is a schematic cross-sectional view showing an example of a method for manufacturing a second example of the structure according to the embodiment of the present invention. In FIG. 9, the same components as those of the structure 10 shown in FIG. 1 and FIG. 2, the inductor 12 shown in FIG. 3, and the inductor 14 shown in FIG. 4 are denoted by the same reference numerals, and the detailed description thereof will be omitted.

First, as shown in FIG. 9, the structure is prepared in which, for example, the inductor 12 and the inductor 14 are provided spaced apart from each other on the substrate 20. The interlayer insulating film 22 is provided on the entire surface of the surface 20a of the substrate 20. The inductor 12 and the inductor 14 are provided in the interlayer insulating film 22. The interlayer insulating film 22 is not formed in the opening portion 13 of the inductor 12 and the opening portion 15 of the inductor 14.

Next, the above-mentioned photosensitive composition is applied onto the interlayer insulating film 22 to form the composition layer 23 on the interlayer insulating film 22. The composition layer 23 is also formed in the opening portion 13 of the inductor 12 and the opening portion 15 of the inductor 14. For example, the composition layer 23 is of a negative type, and a non-exposed portion is removed by a development treatment.

Next, a photo mask (not shown) is disposed on the composition layer 23. The photo mask has a configuration in which the mask portion 31a blocks the exposure light Lv, similar to the photo mask 30 shown in FIG. 7. The composition layer 23 in the opening portion 13 of the inductor 12 and the opening portion 15 of the inductor 14 is exposed by the photo mask. After the exposure, a development treatment is carried out to form the electromagnetic wave absorbing film 24 positioned in the opening portion 13 of the inductor 12 and the opening portion 15 of the inductor 14 as shown in FIG. 8. As a result, the structure 10a in FIG. 8 is obtained.

[Third Example of Structure]

Figure 10:
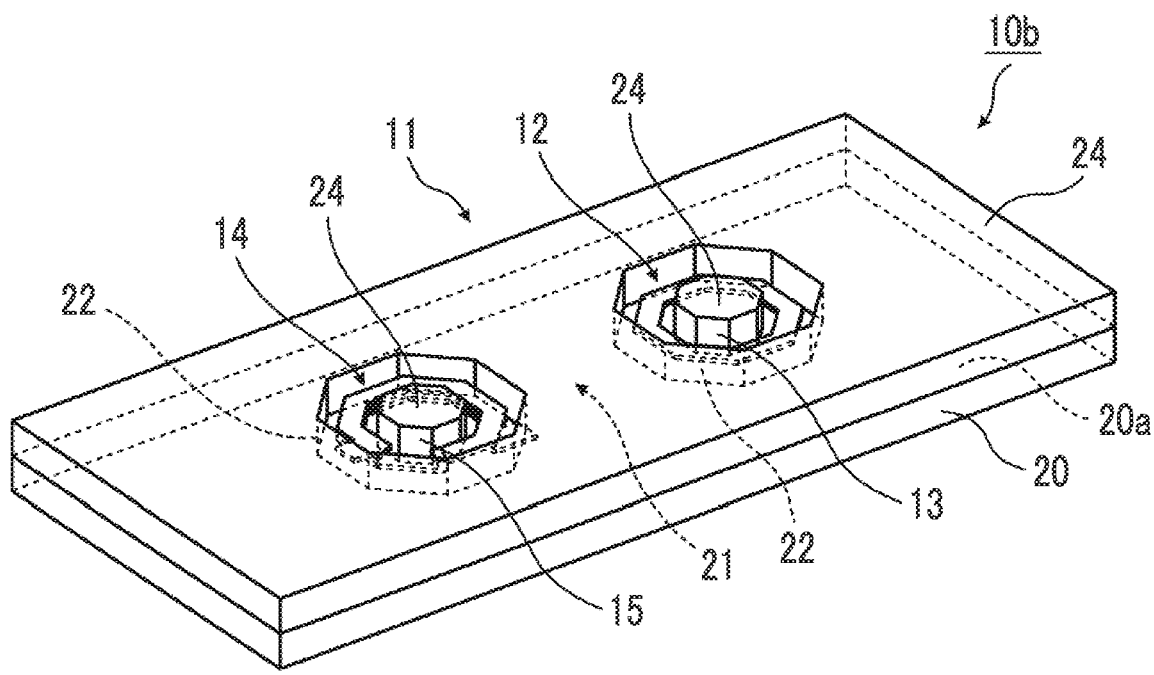
FIG. 10 is a schematic perspective view showing a third example of the structure according to the embodiment of the present invention.

FIG. 10 is a schematic perspective view showing a third example of the structure according to the embodiment of the present invention. In FIG. 10, the same components as those of the structure 10 shown in FIG. 1 and FIG. 2, the inductor 12 shown in FIG. 3, and the inductor 14 shown in FIG. 4 are denoted by the same reference numerals, and the detailed description thereof will be omitted.

A structure 10b in FIG. 10 has the same configuration as the structure 10 shown in FIG. 1 and FIG. 2, except that the electromagnetic wave absorbing film 24 is disposed in the opening portion 13 of the inductor 12 and the opening portion 15 of the inductor 14, as compared with the structure 10 shown in FIG. 1 and FIG. 2.

By providing the electromagnetic wave absorbing film 24 in the opening portion 13 of the inductor 12 and the opening portion 15 of the inductor 14, in addition to providing the electromagnetic wave absorbing film 24 in the region 21 on the substrate 20 between the inductor 12 and the inductor 14, the inductor 12 and the inductor 14 are formed in the electromagnetic wave absorbing film 24, so that electromagnetic waves can be further absorbed. Therefore, the influence of electromagnetic waves on the inductor 12 and the inductor 14 can be further suppressed. Although it is configured such that the electromagnetic wave absorbing film 24 is provided in the opening portion 13 of the inductor 12 and the opening portion 15 of the inductor 14, it may also be configured such that the electromagnetic wave absorbing film 24 is provided in either one of the opening portion 13 of the inductor 12 and the opening portion 15 of the inductor 14. In this case, it is preferable that the electromagnetic wave absorbing film 24 is provided on the side that generates a high-frequency wave as described above. Thereby, electromagnetic waves can be efficiently shielded.

In a case where the inductor 12, the inductor 14, or the balun transformer (not shown) is disposed as a plurality of coiled passive elements of 3 or more, unlike the above-mentioned configuration, the electromagnetic wave absorbing film 24 positioned in at least one opening portion of these coiled passive elements may be formed.

[Method for Manufacturing Third Example of Structure]

Figure 11:
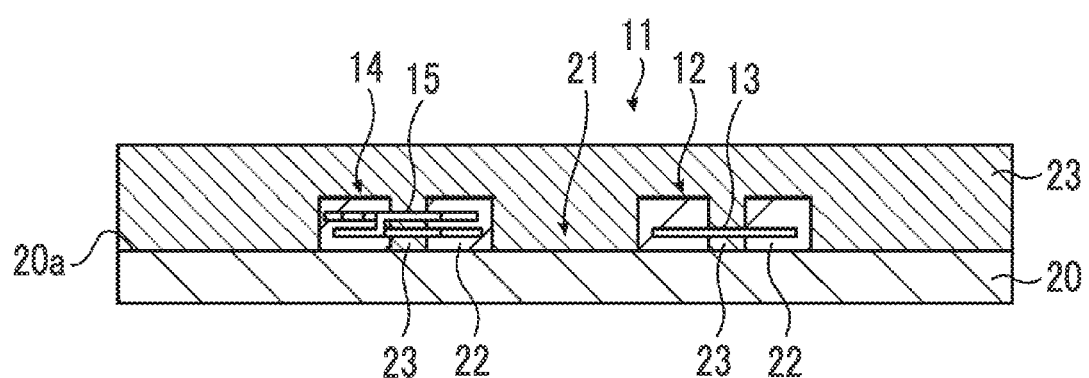
FIG. 11 is a schematic cross-sectional view showing an example of a method for manufacturing the third example of the structure according to the embodiment of the present invention.

FIG. 11 is a schematic cross-sectional view showing an example of a method for manufacturing a third example of the structure according to the embodiment of the present invention. In FIG. 11, the same components as those of the structure 10 shown in FIG. 1 and FIG. 2, the inductor 12 shown in FIG. 3, and the inductor 14 shown in FIG. 4 are denoted by the same reference numerals, and the detailed description thereof will be omitted.

First, as shown in FIG. 11, the structure is prepared in which, for example, two interlayer insulating films 22 are provided spaced apart from each other on the surface 20a of the substrate 20. The inductor 12 and the inductor 14 are provided in each interlayer insulating film 22. The interlayer insulating film 22 is not formed in the opening portion 13 of the inductor 12 and the opening portion 15 of the inductor 14.

Next, the above-mentioned photosensitive composition is applied onto the surface 20a of the substrate 20 to form the composition layer 23 (see FIG. 11) in order to cover the inductor 12 and the inductor 14. The composition layer 23 is formed not only in the region 21 on the substrate 20 between the inductor 12 and the inductor 14 but also in the opening portion 13 of the inductor 12 and the opening portion 15 of the inductor 14. For example, the composition layer 23 is of a negative type, and a non-exposed portion is removed by a development treatment.

Next, a photo mask (not shown) is disposed on the composition layer 23. The photo mask has a configuration in which the mask portion 31a blocks the exposure light Lv, similar to the photo mask 30 shown in FIG. 7. The periphery of the inductor 12, the opening portion 13 of the inductor 12, the periphery of the inductor 14, and the opening portion 15 of the inductor 14 in the composition layer 23 are exposed by the photo mask. After the exposure, a development treatment is carried out to form the electromagnetic wave absorbing film 24 positioned in the opening portion 13 of the inductor 12 and the opening portion 15 of the inductor 14, in addition to forming the electromagnetic wave absorbing film 24 in the region 21 on the substrate 20 between the inductor 12 and the inductor 14 as shown in FIG. 10. As a result, the structure 10b in FIG. 10 is obtained.

[Fourth Example of Structure]

Figure 12:
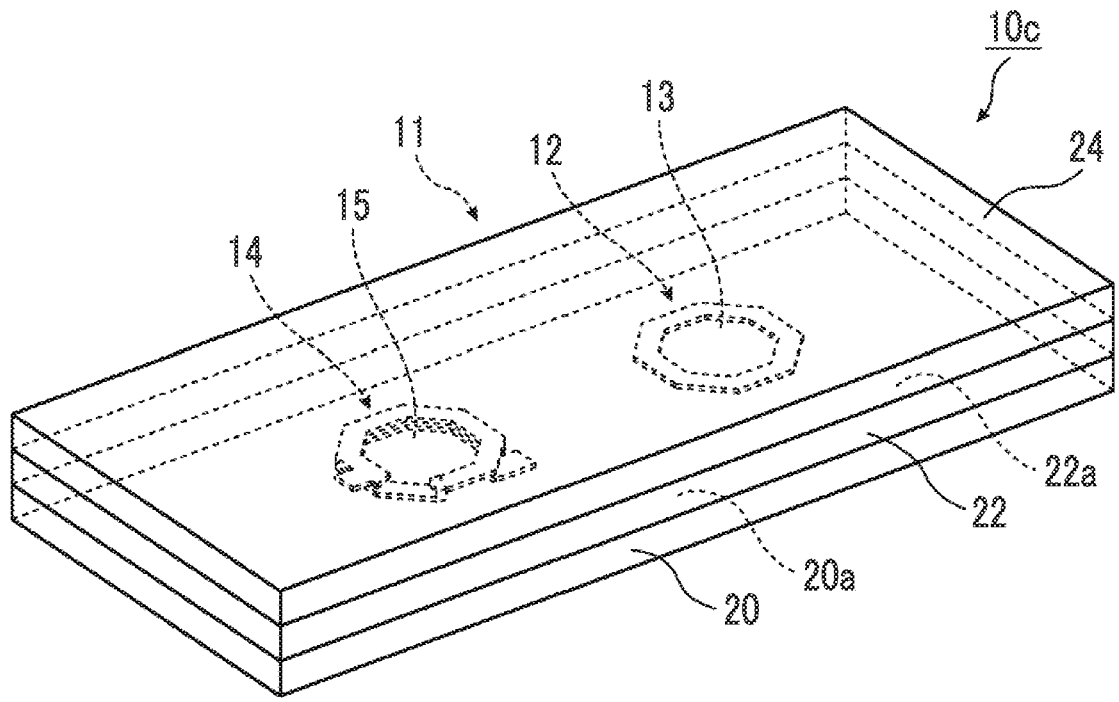
FIG. 12 is a schematic perspective view showing a fourth example of the structure according to the embodiment of the present invention.

FIG. 12 is a schematic perspective view showing a fourth example of the structure according to the embodiment of the present invention. In FIG. 12, the same components as those of the structure 10 shown in FIG. 1 and FIG. 2, the inductor 12 shown in FIG. 3, and the inductor 14 shown in FIG. 4 are denoted by the same reference numerals, and the detailed description thereof will be omitted.

A structure 10c in FIG. 12 has the same configuration as the structure 10 shown in FIG. 1 and FIG. 2, except that the interlayer insulating film 22 is provided around the inductor 12 and the inductor 14 on the surface 20a of the substrate 20, and the electromagnetic wave absorbing film 24 is disposed on the opposite side of the substrate 20 of the inductor 12 and the inductor 14, as compared with the structure 10 shown in FIG. 1 and FIG. 2.

The electromagnetic wave absorbing film 24 is provided on the entire surface of, for example, a surface 22a of the interlayer insulating film 22 as the opposite side of the substrate 20, and the inductor 12 and the inductor 14 are covered with the electromagnetic wave absorbing film 24.

The electromagnetic waves radiated from the inductor 12 or the inductor 14 are absorbed by providing the electromagnetic wave absorbing film 24 that covers the inductor 12 and the inductor 14. Therefore, the same effect as that of the structure 10 shown in FIG. 1 and FIG. 2 can be obtained.

[Method for Manufacturing Fourth Example of Structure]

Figure 13:
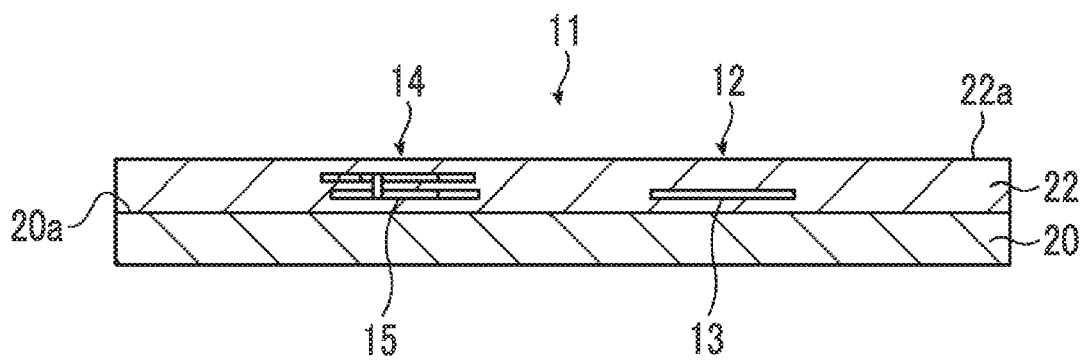
FIG. 13 is a schematic cross-sectional view showing an example of a method for manufacturing the fourth example of the structure according to the embodiment of the present invention.
Figure 14:
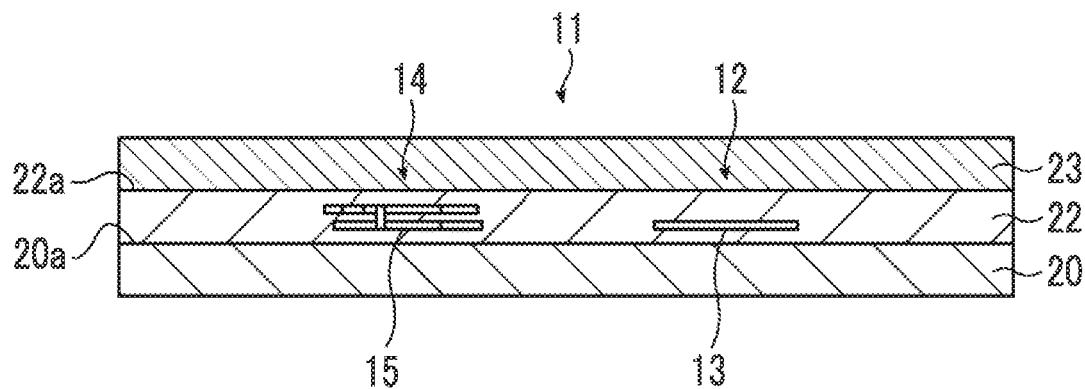
FIG. 14 is a schematic cross-sectional view showing an example of a method for manufacturing the fourth example of the structure according to the embodiment of the present invention.

FIG. 13 and FIG. 14 are schematic cross-sectional views showing an example of a method for manufacturing a fourth example of the structure according to the embodiment of the present invention in the order of steps. In FIG. 13 and FIG. 14, the same components as those of the structure 10 shown in FIG. 1 and FIG. 2, the inductor 12 shown in FIG. 3, and the inductor 14 shown in FIG. 4 are denoted by the same reference numerals, and the detailed description thereof will be omitted.

First, as shown in FIG. 13, the structure is prepared in which, for example, the inductor 12 and the inductor 14 are provided spaced apart from each other on the substrate 20. The inductor 12 and the inductor 14 are provided in the interlayer insulating film 22.

Next, the above-mentioned photosensitive composition is applied onto the entire surface of the surface 22a of the interlayer insulating film 22 to form the composition layer 23 in order to cover the inductor 12 and the inductor 14 as shown in FIG. 14. For example, the composition layer 23 is of a negative type, and a non-exposed portion is removed by a development treatment.

Next, the composition layer 23 is exposed. After the exposure, a development treatment is carried out to form the electromagnetic wave absorbing film 24 on the entire surface of the surface 22a of the interlayer insulating film 22 as shown in FIG. 12, and the inductor 12 and the inductor 14 are covered with the electromagnetic wave absorbing film 24. As a result, the structure 10c in FIG. 12 is obtained.

As long as the electromagnetic wave absorbing film 24 is provided on the opposite side of the substrate 20 of the passive element 11, it is not particularly limited to the above-mentioned configuration in which the electromagnetic wave absorbing film 24 is provided on the entire surface of the surface 22a of the interlayer insulating film 22. For example, the electromagnetic wave absorbing film 24 may be provided on the opposite side of the substrate 20 of at least one of the inductor 12 or the inductor 14. In this case, the electromagnetic wave absorbing film 24 may be provided on the entire surfaces of the inductor 12 and the inductor 14, but it may be configured such that the electromagnetic wave absorbing film 24 is provided in at least one of the opening portion 13 of the inductor 12 or the opening portion 15 of the inductor 14.

[Fifth Example of Structure]

Figure 15:
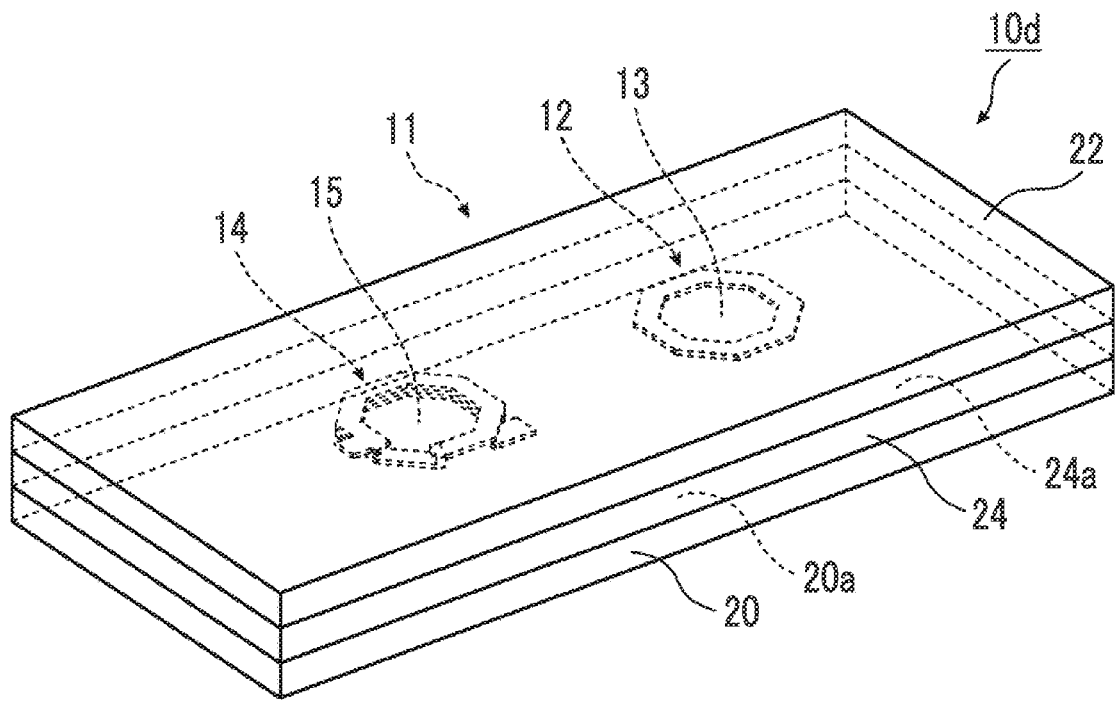
FIG. 15 is a schematic perspective view showing a fifth example of the structure according to the embodiment of the present invention.

FIG. 15 is a schematic perspective view showing a fifth example of the structure according to the embodiment of the present invention. In FIG. 15, the same components as those of the structure 10 shown in FIG. 1 and FIG. 2, the inductor 12 shown in FIG. 3, and the inductor 14 shown in FIG. 4 are denoted by the same reference numerals, and the detailed description thereof will be omitted.

A structure 10d in FIG. 15 has the same configuration as the structure 10 shown in FIG. 1 and FIG. 2, except that the electromagnetic wave absorbing film 24 is disposed between the substrate 20 and the passive element 11, and the inductor 12 and the inductor 14 are provided in the interlayer insulating film 22, as compared with the structure 10 shown in FIG. 1 and FIG. 2.

The electromagnetic wave absorbing film 24 is disposed on the entire surface of the surface 20a of the substrate 20. The inductor 12 and the inductor 14 are provided on the electromagnetic wave absorbing film 24.

By providing the electromagnetic wave absorbing film 24 between the substrate 20 and the passive element 11, electromagnetic waves can be absorbed, and the same effect as that of the structure 10 shown in FIG. 1 and FIG. 2 can be obtained.

It should be noted that the inductor 12 and the inductor 14 are not limited to be provided in the interlayer insulating film 22 as long as those inductors are provided on the electromagnetic wave absorbing film 24. The inductor 12 and the inductor 14 may be provided on the electromagnetic wave absorbing film 24 in a state where the interlayer insulating film 22 is not provided.

As long as the electromagnetic wave absorbing film 24 is provided between the substrate 20 and the passive element 11, it is not particularly limited to the above-mentioned configuration in which the electromagnetic wave absorbing film 24 is provided on the entire surface of the surface 20a of the substrate 20. For example, the electromagnetic wave absorbing film 24 may be provided between at least one of the inductor 12 or the inductor 14 and the substrate 20. In this case, the electromagnetic wave absorbing film 24 may be provided on the entire surfaces of the inductor 12 and the inductor 14, but it may be configured such that the electromagnetic wave absorbing film 24 is provided in at least one of the opening portion 13 of the inductor 12 or the opening portion 15 of the inductor 14. Thereby, electromagnetic waves can be efficiently shielded as described above.

[Method for Manufacturing Fifth Example of Structure]

Figure 16:
FIG. 16 is a schematic cross-sectional view showing an example of a method for manufacturing the fifth example of the structure according to the embodiment of the present invention.
Figure 17:
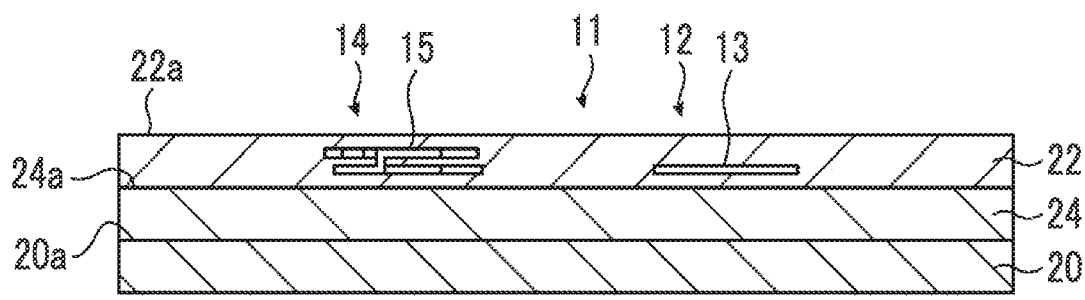
FIG. 17 is a schematic cross-sectional view showing an example of a method for manufacturing the fifth example of the structure according to the embodiment of the present invention.

FIG. 16 and FIG. 17 are schematic cross-sectional views showing an example of a method for manufacturing a fifth example of the structure according to the embodiment of the present invention in the order of steps. In FIG. 16 and FIG. 17, the same components as those of the structure 10 shown in FIG. 1 and FIG. 2, the inductor 12 shown in FIG. 3, and the inductor 14 shown in FIG. 4 are denoted by the same reference numerals, and the detailed description thereof will be omitted.

First, as shown in FIG. 16, the above-mentioned photosensitive composition is applied onto the entire surface of the surface 20a of the substrate 20 to form the composition layer 23 on the entire surface of the surface 20a of the substrate 20. For example, the composition layer 23 is of a negative type, and a non-exposed portion is removed by a development treatment.

Next, the entire composition layer 23 is exposed. After the exposure, a development treatment is carried out to form the electromagnetic wave absorbing film 24 on the entire surface of the surface 20a of the substrate 20 as shown in FIG. 17.

Next, the inductor 12 and the inductor 14 are formed on the electromagnetic wave absorbing film 24. In this case, the inductor 12 and the inductor 14 are formed in the interlayer insulating film 22. As a result, the structure 10d shown in FIG. 15 is obtained.

The inductor 12 and the inductor 14 are formed, for example, by a device microfabrication technique in which steps such as lamination sputtering, physical vapor deposition (PVD), chemical vapor deposition (CVD), photolithography, dry etching, wet etching, plasma ashing, copper electrolytic plating, chemical mechanical polishing (CMP) slurry polishing, and wet etching are combined a plurality of times.

The inductor 12 and the inductor 14 may be formed directly on the electromagnetic wave absorbing film 24 without being formed in the interlayer insulating film 22.

[Sixth Example of Structure]

Figure 18:
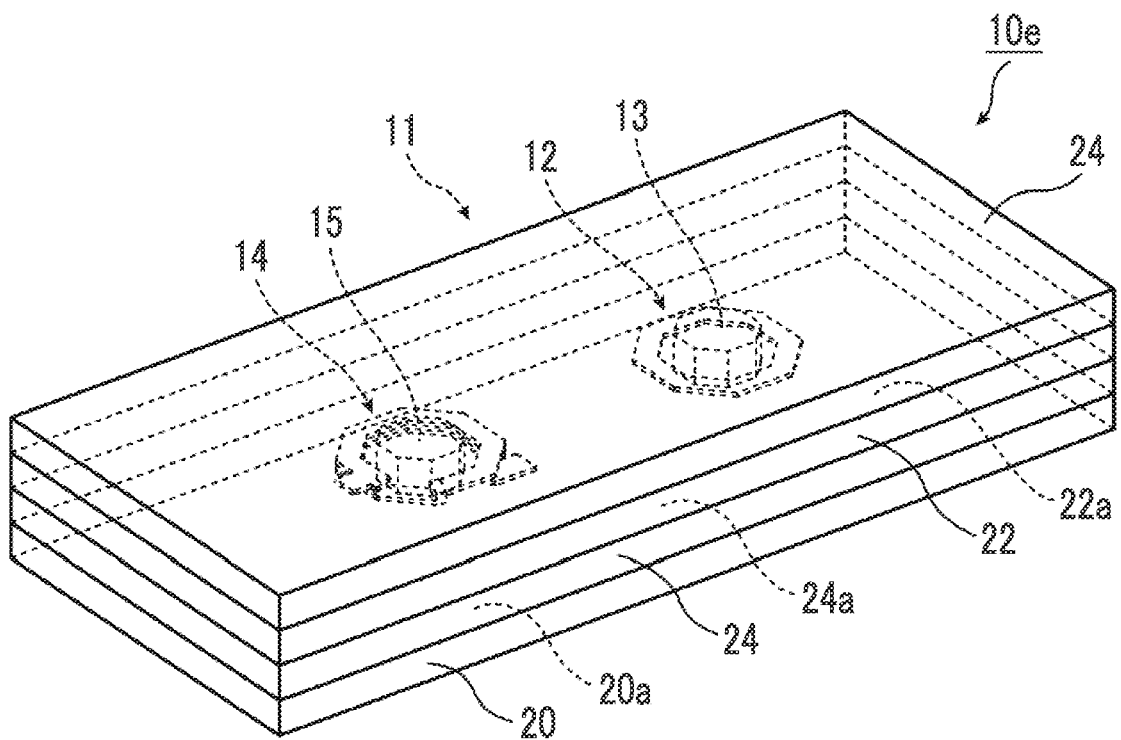
FIG. 18 is a schematic perspective view showing a sixth example of the structure according to the embodiment of the present invention.

FIG. 18 is a schematic perspective view showing a sixth example of the structure according to the embodiment of the present invention. In FIG. 18, the same components as those of the structure 10 shown in FIG. 1 and FIG. 2, the inductor 12 shown in FIG. 3, and the inductor 14 shown in FIG. 4 are denoted by the same reference numerals, and the detailed description thereof will be omitted.

A structure 10e in FIG. 18 has the same configuration as the structure 10 shown in FIG. 1 and FIG. 2, except that the electromagnetic wave absorbing film 24 is disposed between the substrate 20 and the passive element 11, the electromagnetic wave absorbing film 24 is disposed on the opposite side of the substrate 20 of the inductor 12 and the inductor 14, and the inductor 12 and the inductor 14 are provided in the interlayer insulating film 22, as compared with the structure 10 shown in FIG. 1 and FIG. 2.

The electromagnetic wave absorbing film 24 is disposed on the entire surface of the surface 20a of the substrate 20. The interlayer insulating film 22 is disposed on the entire surface of the surface 24a of the electromagnetic wave absorbing film 24, and the inductor 12 and the inductor 14 are provided in the interlayer insulating film 22. The inductor 12 and the inductor 14 are provided on the electromagnetic wave absorbing film 24. Further, the electromagnetic wave absorbing film 24 is further provided on the entire surface of the surface 22a of the interlayer insulating film 22. The inductor 12 and the inductor 14 are covered with the electromagnetic wave absorbing film 24.

By providing the electromagnetic wave absorbing film 24 between the substrate 20 and the passive element 11 and providing the electromagnetic wave absorbing film 24 that covers the inductor 12 and the inductor 14, it is possible to absorb electromagnetic waves radiated to the surface 20a side of the substrate 20 and electromagnetic waves radiated to the opposite side of the surface 20a of the substrate 20, and it is possible to absorb electromagnetic waves in a wider range than the structure 10 shown in FIG. 1 and FIG. 2. It should be noted that the structure 10e can obtain the same effect as that of the structure 10. In addition, the structure 10e has a larger number of layers than the structure 10.

Even in the structure 10e, as described above, as long as the electromagnetic wave absorbing film 24 is provided on the opposite side of the substrate 20 of the passive element 11, it is not particularly limited to the above-mentioned configuration in which the electromagnetic wave absorbing film 24 is provided on the entire surface of the surface 22a of the interlayer insulating film 22. For example, the electromagnetic wave absorbing film 24 may be provided on the opposite side of the substrate 20 of at least one of the inductor 12 or the inductor 14. In this case, the electromagnetic wave absorbing film 24 as an upper layer may be provided on the entire surfaces of the inductor 12 and the inductor 14, but it may be configured such that the electromagnetic wave absorbing film 24 as an upper layer is provided in at least one of the opening portion 13 of the inductor 12 or the opening portion 15 of the inductor 14.

The structure 10e in FIG. 18 has a configuration in which the structure 10c in FIG. 12 and the structure 10d in FIG. 15 are combined. As for the disposition of the electromagnetic wave absorbing film 24, either one of the structure 10c in FIG. 12 and the structure 10d in FIG. 15 may be taken as described above.

[Method for Manufacturing Sixth Example of Structure]

Figure 19:
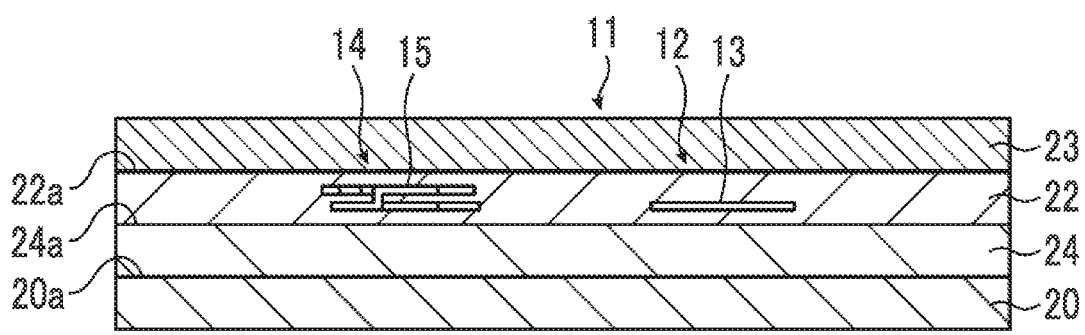
FIG. 19 is a schematic cross-sectional view showing an example of a method for manufacturing the sixth example of the structure according to the embodiment of the present invention.

FIG. 19 is a schematic cross-sectional view showing an example of a method for manufacturing a sixth example of the structure according to the embodiment of the present invention in the order of steps. In FIG. 19, the same components as those of the structure 10 shown in FIG. 1 and FIG. 2, the inductor 12 shown in FIG. 3, and the inductor 14 shown in FIG. 4 are denoted by the same reference numerals, and the detailed description thereof will be omitted.

The structure 10e in FIG. 18 has a configuration in which the electromagnetic wave absorbing film 24 is disposed on the opposite side of the substrate 20 of the inductor 12 and the inductor 14, in the structure 10d shown in FIG. 15.

In the configuration shown in FIG. 17, the above-mentioned photosensitive composition is applied onto the entire surface of the surface 22a of the interlayer insulating film 22 provided with the inductor 12 and the inductor 14 inside to form the composition layer 23 on the interlayer insulating film 22 as shown in FIG. 19. For example, the composition layer 23 is of a negative type, and a non-exposed portion is removed by a development treatment.

Next, the composition layer 23 is exposed. After the exposure, a development treatment is carried out to further form the electromagnetic wave absorbing film 24 as an upper layer on the interlayer insulating film 22 provided with the inductor 12 and the inductor 14 as shown in FIG. 18. As a result, the structure 10e shown in FIG. 18 is obtained.

In a case where the inductor 12 and the inductor 14 are formed on the electromagnetic wave absorbing film 24 formed on the substrate 20 without providing the interlayer insulating film 22, the electromagnetic wave absorbing film 24 as an upper layer is further formed on the electromagnetic wave absorbing film 24 on which a plurality of passive elements 11, for example, the inductor 12 and the inductor 14 are formed.

Figure 20:
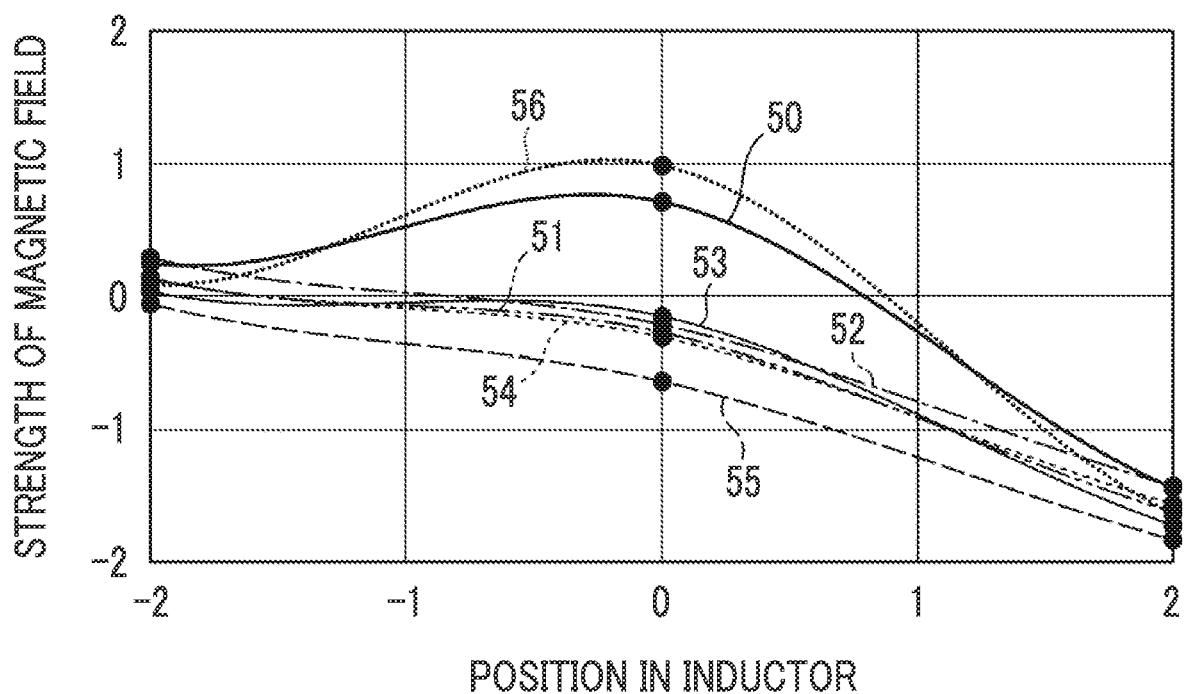
FIG. 20 is a graph showing an example of a magnetic field of an inductor.

In the first to sixth examples of the structure described above, in a case where a high-frequency signal of 60 GHz is input to the inductor 14, the magnetic field above the inductor 12 is as shown in FIG. 20, for example. FIG. 20 also shows a configuration without an electromagnetic wave absorbing film for reference (see the curve 56). From FIG. 20, the magnetic field above the inductor 12 varies depending on the position in the inductor 12. By providing the electromagnetic wave absorbing film 24, the magnetic field above the inductor 12 can be made smaller than in a case where the electromagnetic wave absorbing film 24 is not provided. That is, providing the electromagnetic wave absorbing film 24 leads to absorption of electromagnetic waves reaching the inductor 12 and a decrease in the magnetic field of the inductor 12, thus making it possible to reduce the influence of the high-frequency wave.

In FIG. 20, the curve 50 shows a configuration in which the electromagnetic wave absorbing film 24 is provided in the region 21 on the substrate 20 between the inductor 12 and the inductor 14 (see FIG. 1). The curve 51 shows a configuration in which the electromagnetic wave absorbing film 24 is provided in the opening portion 13 of the inductor 12 and the opening portion 15 of the inductor 14 (see FIG. 8). The curve 52 shows a configuration in which the electromagnetic wave absorbing film 24 is provided in the region 21 on the substrate 20 between the inductor 12 and the inductor 14 and in the opening portion 13 of the inductor 12 and the opening portion 15 of the inductor 14 (see FIG. 10). The curve 53 shows a configuration in which the electromagnetic wave absorbing film 24 is provided above the inductor 12 and the inductor 14 (see FIG. 12). The curve 54 shows a configuration in which the electromagnetic wave absorbing film 24 is provided between the substrate 20 and the inductor 12 and the inductor 14 (see FIG. 15). The curve 55 shows a configuration in which the electromagnetic wave absorbing film 24 is provided between the substrate 20 and the inductor 12 and the inductor 14, and above the inductor 12 and the inductor 14 (see FIG. 18).

As shown in FIG. 20, the configuration in which the electromagnetic wave absorbing film 24 is provided in the opening portion 13 of the inductor 12 and the opening portion 15 of the inductor 14 (see the curve 51) can reduce the magnetic field with a small electromagnetic wave absorbing film 24 to the same extent as the configuration in which the electromagnetic wave absorbing film 24 is provided between the substrate 20 and the inductor 12 and the inductor 14 (see the curve 54).

The electromagnetic wave absorbing film 24 is provided as described above. In a case where the electromagnetic wave absorbing film 24 is provided in the passive elements 11 of the inductor 12 and the inductor 14, the electromagnetic wave absorbing film 24 may be provided directly in the passive element 11, or the above-mentioned interlayer insulating film 22 may be provided between the passive element 11 and the electromagnetic wave absorbing film 24. The electromagnetic wave absorbing film 24 may be provided in a state where the passive element 11 is surrounded by an electrically insulating layer. As such, there may be another layer between the passive element 11 and the electromagnetic wave absorbing film 24.

In the interlayer insulating film 22 and the electrically insulating layer, for example, the real part μ' of the complex relative magnetic permeability μ is 1 and the complex part μ" of the complex relative magnetic permeability μ is zero, as described above.

<Other Configurations>

A variety of antennas used in the communication standard fifth generation (5G) using a frequency band of 28 GHz to 80 GHz can be used as the antenna.

For example, a patch antenna, a dipole antenna, or a phased array antenna can be used as the antenna.

The antenna is composed of, for example, copper or aluminum. In addition, the thickness of the antenna is preferably 20 to 50 μm. For example, in a case where a printed substrate such as Flame Retardant Type 1 to Type 5 (FR-1 to FR-5) is used, a thickness of a copper wiring line is determined by the standards, and the thickness of the antenna also conforms to the thickness of the copper wiring line. In addition, the thickness of the antenna may conform to a thickness of copper foil (see Table 6 and the like of the Japanese Industrial Standards (JIS) C 6484: 2005) of a copper-clad laminate specified in JIS C 6484: 2005. Further, in a case where the antenna is formed of copper by electrolytic plating, the thickness of the antenna is preferably a film thickness that can be formed by electrolytic plating.

Examples of the semiconductor element include the following.

The semiconductor element is not particularly limited, and examples thereof include logic large scale integration (LSI) (for example, an application specific integrated circuit (ASIC), a field programmable gate array (FPGA), and an application specific standard product (ASSP)), microprocessors (for example, a central processing unit (CPU) and a graphics processing unit (GPU)), memories (for example, a dynamic random access memory (DRAM), a hybrid memory cube (HMC), a magnetic RAM (MRAM), a phase-change memory (PCM), a resistive RAM (ReRAM), a ferroelectric RAM (FeRAM), and a flash memory (such as a Not AND (NAND) flash)), power devices, analog integrated circuits (IC) (for example, a direct current (DC)-direct current (DC) converter and an isolated gate bipolar transistor (IGBT)), A/D converters, micro electro mechanical systems (MEMS) (for example, an acceleration sensor, a pressure sensor, an oscillator, and a gyro sensor), power amplifiers, wireless (for example, a global positioning system (GPS), frequency modulation (FM), near field communication (NFC), an RF expansion module (RFEM), a monolithic microwave integrated circuit (MMIC), and a wireless local area network (WLAN)), discrete elements, back side illumination (BSI), contact image sensors (CIS), camera modules, complementary metal oxide semiconductors (CMOS), passive devices, bandpass filters, surface acoustic wave (SAW) filters, radio frequency (RF) filters, radio frequency integrated passive devices (RFIPD), and broadband (BB).

[Antenna-In-Package and Method for Manufacturing Antenna-In-Package]

The antenna-in-package has a configuration in which an antenna and a front end module (FEM) are laminated. The FEM is an arithmetic circuit part including a CMOS transistor that controls transmission and reception on the antenna side in a radio circuit.

Figure 21:
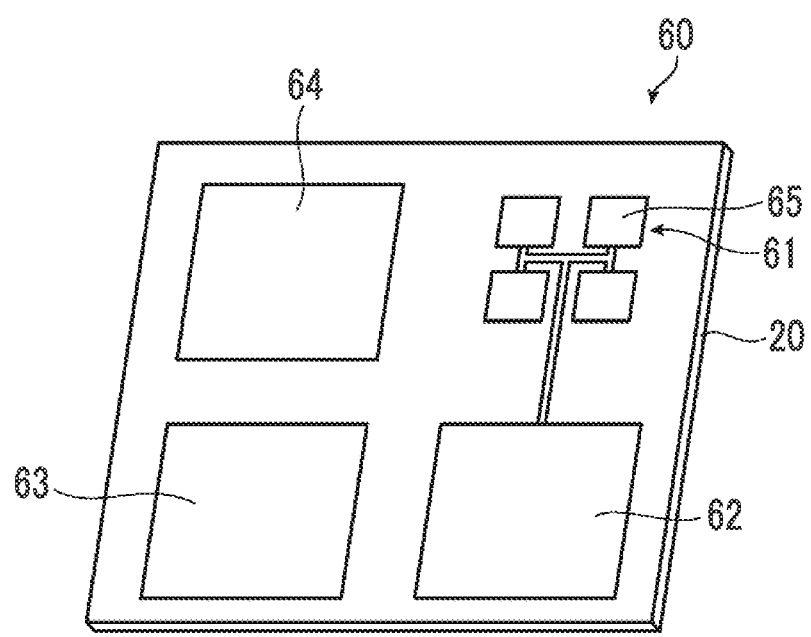
FIG. 21 is a schematic perspective view showing an example of an antenna-in-package.

For example, as shown in FIG. 21, an antenna-in-package 60 has a configuration in which an array antenna 61, an A/D circuit 62, a memory 63, an ASIC 64, and the like are laminated on a substrate 20.

The array antenna 61 has, for example, four antennas 65. For example, the four antennas 65 are all the same. The configurations of the array antenna 61 and the antenna 65 are not particularly limited, and are appropriately determined according to a frequency band for transmission or reception, a polarization direction for reception, and the like. In addition, the array antenna 61 has four antennas 65, but the present invention is not limited thereto. A single antenna may be used instead of the array antenna 61.

As for the method for manufacturing the antenna-in-package, other than the method for manufacturing the electromagnetic wave absorbing film 24, known methods can be appropriately used for the antenna, the A/D circuit, the memory, the ASIC, and the like.

It should be noted that the present invention is not limited to the antenna-in-package, and can be applied to a radar or the like.

Hereinafter, the photosensitive composition and the method for manufacturing the structure will be described.

The photosensitive composition may be a negative type photosensitive composition or a positive type photosensitive composition. In a case of a negative type photosensitive composition, the composition often contains a polymerizable compound which will be described later.

The photosensitive composition is a composition for use in forming the electromagnetic wave absorbing film.

In a case where a real part of a complex relative magnetic permeability $\mu$ of an electromagnetic wave absorbing film formed of the composition is defined as $\mu'$ and a complex part of the complex relative magnetic permeability $\mu$ of the electromagnetic wave absorbing film is defined as $\mu''$, the complex part $\mu''$ of the complex relative magnetic permeability $\mu$ of the electromagnetic wave absorbing film satisfies any one of the following requirements 1 to 3.

Requirement 1: $\mu''$ at a frequency of 28 GHz is 0.1 to 10
Requirement 2: $\mu''$ at a frequency of 47 GHz is 0.1 to 5
Requirement 3: $\mu''$ at a frequency of 60 GHz is 0.1 to 2

It should be noted that the complex part $\mu''$ of the complex relative magnetic permeability $\mu$ of the electromagnetic wave absorbing film formed of the composition can also be measured in the same manner as the real part $\mu'$ and the complex part $\mu''$ of the complex relative magnetic permeability $\mu$ of the above-mentioned electromagnetic wave absorbing film.

In the following, first, various components contained in the photosensitive composition will be described in detail.

[Magnetic Particles]

The photosensitive composition contains magnetic particles. The magnetic particle may be one type or a plurality of types.

The magnetic particles contain a metal atom.

In the present specification, the metal atom also includes metalloid atoms such as boron, silicon, germanium, arsenic, antimony, and tellurium.

The metal atom may be contained in the magnetic particles as an alloy containing a metal element (preferably a magnetic alloy), a metal oxide (preferably a magnetic oxide), a metal nitride (preferably a magnetic nitride), or a metal carbide (preferably a magnetic carbide).

The content of the metal atom with respect to the total mass of the magnetic particles is preferably 50% to 100% by mass, more preferably 75% to 100% by mass, and still more preferably 95% to 100% by mass.

The metal atom is not particularly limited, and the magnetic particles preferably contain at least one metal atom selected from the group consisting of Fe, Ni, and Co.

The content of at least one metal atom selected from the group consisting of Fe, Ni, and Co (the total content of a plurality of types of metal atoms in a case where the plurality of types of metal atoms are contained) is preferably 50% by mass or more, more preferably 60% by mass or more, and still more preferably 70% by mass or more with respect to the total mass of the metal atoms in the magnetic particles.

The upper limit value of the content of the metal atom is not particularly limited, and is, for example, 100% by mass or less, preferably 98% by mass or less, and more preferably 95% by mass or less.

The magnetic particles may contain a material other than Fe, Ni, and Co, specific examples of which include Al, Si, S, Sc, Ti, V, Cu, Y, Mo, Rh, Pd, Ag, Sn, Sb, Te, Ba, Ta, W, Re, Au, Bi, La, Ce, Pr, Nd, P, Zn, Zr, Mn, Cr, Nb, Pb, Ca, B, C, N, and O.

In a case where the magnetic particles contain a metal atom other than Fe, Ni, and Co, it is preferable that the magnetic particles contain one or more metal atoms selected from the group consisting of Si, Cr, B, and Mo.

Examples of the magnetic particles include alloys such as a Fe—Co-based alloy (preferably Permendur), a Fe—Ni-based alloy (for example, Permalloy), a Fe—Zr-based alloy, a Fe—Mn-based alloy, a Fe—Si-based alloy, a Fe—Al-based alloy, a Ni—Mo-based alloy (preferably Supermalloy), a Fe—Ni—Co-based alloy, a Fe—Si—Cr-based alloy, a Fe—Si—B-based alloy, a Fe—Si—Al-based alloy (preferably Sendust), a Fe—Si—B—C-based alloy, a Fe—Si—B—Cr-based alloy, a Fe—Si—B—Cr—C-based alloy, a Fe—Co—Si—B-based alloy, a Fe—Si—B—Nb-based alloy, a Fe nanocrystalline alloy, a Fe-based amorphous alloy, and a Co-based amorphous alloy, as well as ferrites such as a spinel ferrite (preferably a Ni—Zn-based ferrite or a Mn—Zn-based ferrite) and a hexagonal ferrite (preferably a barium ferrite or a magnetoplumbite type hexagonal ferrite). The alloy may be amorphous.

The hexagonal ferrite preferable from the viewpoint of radio wave absorption performance may be, for example, a substituted magnetoplumbite type hexagonal ferrite in which some of iron atoms in hexagonal ferrite are substituted with aluminum atoms. Further, a Ba—Fe—Al-based alloy, a Ca—Fe—Al-based alloy, or a Pb—Fe—Al-based alloy in which a part of the alloy is substituted with Ba, Ca, or Pb is more preferable from the viewpoint of absorption of radio waves in a high frequency band.

One type of magnetic particle may be used alone, or two or more types of magnetic particles may be used in combination.

A surface layer may be provided on the surface of the magnetic particle. In a case where the magnetic particle has a surface layer in this manner, the magnetic particle can be provided with a function according to the material of the surface layer.

The surface layer may be, for example, an inorganic layer or an organic layer.

The thickness of the surface layer is not particularly limited, and is preferably 3 to 1,000 nm from the viewpoint that the function of the surface layer is more exhibited.

The average primary particle diameter of the magnetic particles is preferably 20 to 1,000 nm. The number average particle diameter of the magnetic particles is more preferably 20 to 500 nm from the viewpoint of dispersion in a composition and pattern resolution.

The average primary particle diameter of the magnetic particle is measured in such a manner that the magnetic particle is imaged with a transmission electron microscope at an imaging magnification of 100,000×, the magnetic particle image is printed on a printing paper at a total magnification of 500,000×, and in the obtained particle image, the contour of the particle (primary particle) is traced with a digitizer and then the diameter of a circle having the same area as the traced region (circular area phase diameter) is calculated. Here, the primary particle refers to an independent particle without aggregation. Imaging using a transmission electron microscope shall be carried out by a direct method using a transmission electron microscope at an acceleration voltage of 300 kV. The observation and measurement with the transmission electron microscope can be carried out using, for example, a transmission electron microscope H-9000 (manufactured by Hitachi Ltd.) and an image analysis software KS-400 (manufactured by Carl Zeiss AG). The average primary particle diameter is calculated by arithmetically averaging the particle diameters of at least 100 primary particles of the magnetic particles measured above.

The shape of the magnetic particle is not particularly limited, and may be any of a plate shape, an elliptical shape, a spherical shape, and an amorphous shape.

The content of the magnetic particles is preferably 20% to 99% by mass, more preferably 25% to 80% by mass, and still more preferably 30% to 60% by mass with respect to the total mass of the composition.

The content of the magnetic particles is preferably 30% to 99% by mass, more preferably 30% to 80% by mass, and still more preferably 40% to 70% by mass with respect to the total solid content of the composition.

The total solid content of the composition means a component constituting the magnetic pattern portion excluding the solvent in the composition. As long as such a component is a component constituting the magnetic pattern portion, it is regarded as a solid content even in a case where the property thereof is liquid.

[Polymerizable Compound]

The photosensitive composition may contain a polymerizable compound.

The polymerizable compound is a compound having a polymerizable group (photopolymerizable compound), and examples thereof include a compound containing a group containing an ethylenically unsaturated bond (hereinafter, also simply referred to as an "ethylenically unsaturated group"), and a compound having an epoxy group and/or an oxetanyl group, among which a compound containing an ethylenically unsaturated group is preferable.

The composition preferably contains a low-molecular-weight compound containing an ethylenically unsaturated group as the polymerizable compound.

The polymerizable compound is preferably a compound containing one or more ethylenically unsaturated bonds, more preferably a compound containing two or more ethylenically unsaturated bonds, still more preferably a compound containing three or more ethylenically unsaturated bonds, and particularly preferably a compound containing five or more ethylenically unsaturated bonds. The upper limit of the number of ethylenically unsaturated bonds is, for example, 15 or less. Examples of the ethylenically unsaturated group include a vinyl group, a (meth)allyl group, and a (meth)acryloyl group.

The polymerizable compound is preferably dipentaerythritol triacrylate (commercially available as KAYARAD D-330, manufactured by Nippon Kayaku Co., Ltd.), dipentaerythritol tetraacrylate (commercially available as KAYARAD D-320, manufactured by Nippon Kayaku Co., Ltd.), dipentaerythritol penta(meth)acrylate (commercially available as KAYARAD D-310, manufactured by Nippon Kayaku Co., Ltd.), dipentaerythritol hexa(meth)acrylate (commercially available as KAYARAD DPHA, manufactured by Nippon Kayaku Co., Ltd., and A-DPH-12E, manufactured by Shin-Nakamura Chemical Co., Ltd.), or a structure in which the (meth)acryloyl group thereof is through an ethylene glycol residue or a propylene glycol residue (for example, SR454 and SR499 commercially available from Sartomer Company). An oligomer type thereof can also be used. In addition, NK ESTER A-TMMT (pentaerythritol tetraacrylate, manufactured by Shin-Nakamura Chemical Co., Ltd.), KAYARAD RP-1040, KAYARAD DPEA-12LT, KAYARAD DPHA LT, KAYARAD RP-3060, and KAYARAD DPEA-12 (all trade names, manufactured by Nippon Kayaku Co., Ltd.), and the like may be used.

The polymerizable compound may have an acid group such as a carboxylic acid group, a sulfonic acid group, or a phosphoric acid group.

The acid value of the polymerizable compound containing an acid group is preferably 0.1 to 40 mgKOH/g and more preferably 5 to 30 mgKOH/g.

The content of the polymerizable compound in the composition is not particularly limited, and is preferably 1% to 40% by mass, more preferably 5% to 30% by mass, and still more preferably 10% to 25% by mass with respect to the total solid content of the composition.

The composition may contain materials other than the above-mentioned magnetic particles and polymerizable compound.

[Resin]

The composition may contain a resin.

Examples of the resin include a (meth)acrylic resin, an epoxy resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, a styrene resin, and a phenoxy resin.

One type of these resins may be used alone, or two or more types of these resins may be used in admixture.

A suitable aspect of the resin may be, for example, a resin having an unsaturated double bond (for example, an ethylenically unsaturated double bond) and a polymerizable group such as an epoxy group or an oxetanyl group.

In addition, a suitable aspect of the resin may be, for example, a resin having an acid group, a basic group, or an amide group. The resin having an acid group, a basic group, or an amide group tends to exhibit a function as a dispersing agent for dispersing magnetic particles.

Examples of the acid group include a carboxy group, a phosphoric acid group, a sulfo group, and a phenolic hydroxyl group, among which a carboxy group is preferable.

Examples of the basic group include an amino group (a group obtained by removing one hydrogen atom from ammonia, a primary amine, or a secondary amine) and an imino group.

Above all, the resin preferably has a carboxy group or an amide group.

In a case where the resin has an acid group, the acid value of the resin is preferably 10 to 500 mgKOH/g and more preferably 30 to 400 mgKOH/g.

As the resin, from the viewpoint of improving the dispersibility of the resin in the composition, it is preferable to use a resin having a solubility in a solvent of 10 g/L or more, and it is more preferable to use a resin having a solubility in a solvent of 20 g/L or more.

The upper limit value of the solubility of the resin in a solvent is preferably 2,000 g/L or less and more preferably 1,000 g/L or less.

The solubility of the resin in a solvent means a dissolution amount (g) of the resin in 1 L of the solvent at 25° C.

The content of the resin is preferably 0.1% to 30% by mass, more preferably 1% to 25% by mass, and still more preferably 5% to 20% by mass with respect to the total mass of the composition.

A suitable aspect of the resin may be, for example, a resin that functions as a dispersing agent for dispersing magnetic particles in the composition (hereinafter, also referred to as a "dispersion resin"). The effect of the present invention is more excellent by using the dispersion resin.

[Resin Having Repeating Unit Containing Graft Chain]

The dispersion resin may be, for example, a resin having a repeating unit containing a graft chain (hereinafter, also referred to as "resin A"). In this regard, the resin A can be used for a purpose other than exhibiting the function as a dispersing agent.

In a case where the composition contains the resin A, the content of the resin A is preferably 0.1% to 30% by mass, more preferably 0.5% to 20% by mass, and still more preferably 1% to 10% by mass with respect to the total mass of the composition, from the viewpoint that the effect of the present invention is more excellent.

Repeating Unit Containing Graft Chain

In the repeating unit containing a graft chain, a longer graft chain leads to a higher steric repulsion effect, which improves the dispersibility of magnetic particles. On the other hand, in a case where the graft chain is too long, the adsorption power to the magnetic particles tends to decrease, and therefore the dispersibility of the magnetic particles tends to decrease. For this reason, the graft chain preferably has 40 to 10,000 atoms excluding hydrogen atoms, more preferably 50 to 2,000 atoms excluding hydrogen atoms, and still more preferably 60 to 500 atoms excluding hydrogen atoms.

Here, the graft chain indicates from a root of a main chain (an atom bonded to the main chain in a group branched from the main chain) to a terminal of the group branched from the main chain.

In addition, the graft chain preferably contains a polymer structure, and examples of such a polymer structure include a poly(meth)acrylate structure (for example, a poly(meth)acrylic structure), a polyester structure, a polyurethane structure, a polyurea structure, a polyamide structure, and a polyether structure.

In order to improve the interactivity between the graft chain and the solvent, thereby enhancing the dispersibility of magnetic particles, the graft chain is preferably a graft chain containing at least one selected from the group consisting of a polyester structure, a polyether structure, and a poly(meth)acrylate structure, and more preferably a graft chain containing at least one of a polyester structure or a polyether structure.

The resin A may be a resin obtained using a macromonomer containing a graft chain (a monomer having a polymer structure and being bonded to a main chain to constitute a graft chain).

The macromonomer containing a graft chain (the monomer having a polymer structure and being bonded to a main chain to constitute a graft chain) is not particularly limited, and a macromonomer containing a reactive double bond group can be suitably used.

The resin A preferably contains at least one structure selected from the group consisting of a poly(methyl acrylate), a poly(methyl methacrylate), and a cyclic or chain-like polyester, more preferably contains at least one structure selected from the group consisting of a poly(methyl acrylate), a poly(methyl methacrylate), and a chain-like polyester, and still more preferably contains at least one structure selected from the group consisting of a poly(methyl acrylate) structure, a poly(methyl methacrylate) structure, a polycaprolactone structure, and a polyvalerolactone structure. The resin A may contain one type of the above-mentioned structure alone, or may contain a plurality of the above-mentioned structures.

Here, the polycaprolactone structure refers to a structure containing a structure in which ε-caprolactone is ring-opened as a repeating unit. The polyvalerolactone structure refers to a structure containing a structure in which δ-valerolactone is ring-opened as a repeating unit.

The content of the repeating unit containing a graft chain in the resin A is preferably 2% to 100% by mass, more preferably 2% to 90% by mass, and still more preferably 5% to 30% by mass with respect to the total mass of the resin A in terms of mass. The effect of the present invention is more excellent in a case where the repeating unit containing a graft chain is contained in this range.

Hydrophobic Repeating Unit

In addition, the resin A may contain a hydrophobic repeating unit that is different from the repeating unit containing a graft chain (that is, a hydrophobic repeating unit that does not correspond to the repeating unit containing a graft chain). In this regard, in the present specification, the hydrophobic repeating unit is a repeating unit that does not have an acid group (for example, a carboxylic acid group, a sulfonic acid group, a phosphoric acid group, or a phenolic hydroxyl group).

The hydrophobic repeating unit is preferably a repeating unit derived from (corresponding to) a compound (monomer) having a C log P value of 1.2 or more, and more preferably a repeating unit derived from a compound having a C log P value of 1.2 to 8. In this manner, the effect of the present invention can be more reliably exhibited.

The C log P value is a value calculated by the program "C LOG P", which is available from Daylight Chemical Information System, Inc. This program provides a value of a "calculated log P" calculated by the Hansch and Leo's fragment approach (see literature below). The fragment approach is based on a chemical structure of a compound, and divides the chemical structure into partial structures (fragments) and sums the log P contributions allocated to the fragments to estimate the log P value of the compound. The details thereof are described in the following literature. In the present specification, the C log P value calculated by the program C LOG P v4.82 is used.

A. J. Leo, Comprehensive Medicinal Chemistry, Vol. 4, C. Hansch, P. G. Sammnens, J. B. Taylor and C. A. Ramsden, Eds., p. 295, Pergamon Press, 1990, C. Hansch & A. J. Leo. Substituent Constants For Correlation Analysis in Chemistry and Biology. John Wiley & Sons, A. J. Leo. Calculating log Poct from structure. Chem. Rev., 93, pp. 1281 to 1306, 1993.

The log P means a common logarithm of a partition coefficient P, and is a physical property value that expresses, as a quantitative numerical value, how a certain organic compound is partitioned at an equilibrium in a two-phase system of oil (generally 1-octanol) and water. The log P is represented by the following expression.

$$\log P = \log(C_{oil}/C_{water})$$

In the expression, Coil represents a molar concentration of a compound in an oil phase, and Cwater represents a molar concentration of a compound in a water phase.

In a case where a value of log P increases positively across 0, the oil solubility increases, and in a case where a value of log P increases negatively in terms of an absolute value, the water solubility increases. The value of log P has a negative correlation with the water solubility of an organic compound and is widely used as a parameter for estimating the hydrophilicity and hydrophobicity of the organic compound.

The content of the hydrophobic repeating unit in the resin A is preferably 10% to 90% by mass and more preferably 20% to 80% by mass with respect to the total mass of the resin A in terms of mass.

Functional Group Capable of Forming Interaction with Magnetic Particles

The resin A may have a functional group capable of forming an interaction with magnetic particles.

The resin A preferably further contains a repeating unit containing a functional group capable of forming an interaction with magnetic particles.

Examples of the functional group capable of forming an interaction with magnetic particles include an acid group, a basic group, a coordinating group, and a functional group having reactivity.

In a case where the resin A contains an acid group, a basic group, a coordinating group, or a functional group having reactivity, it is preferable that the resin A contains a repeating unit containing an acid group, a repeating unit containing a basic group, a repeating unit containing a coordinating group, or a repeating unit having a functional group having reactivity.

The repeating unit containing an alkali-soluble group as the acid group may be the same repeating unit as the above-mentioned repeating unit containing a graft chain, or may be a repeating unit different from the above-mentioned repeating unit containing a graft chain, but the repeating unit containing an alkali-soluble group as the acid group is a repeating unit different from the above-mentioned hydrophobic repeating unit (that is, the repeating unit containing an alkali-soluble group as the acid group does not correspond to the above-mentioned hydrophobic repeating unit).

Examples of the acid group which is a functional group capable of forming an interaction with magnetic particles include a carboxylic acid group, a sulfonic acid group, a phosphoric acid group, and a phenolic hydroxyl group, among which at least one of a carboxylic acid group, a sulfonic acid group, or a phosphoric acid group is preferable, and a carboxylic acid group is more preferable. The carboxylic acid group has favorable adsorption power to magnetic particles and high dispersibility.

That is, it is preferable that the resin A further contains a repeating unit containing at least one of a carboxylic acid group, a sulfonic acid group, or a phosphoric acid group.

The resin A may have one or two or more repeating units containing an acid group.

In a case where the resin A contains a repeating unit containing an acid group, the content of the repeating unit containing an acid group is preferably 5% to 80% by mass and more preferably 10% to 60% by mass with respect to the total mass of the resin A in terms of mass.

Examples of the basic group which is a functional group capable of forming an interaction with magnetic particles include a primary amino group, a secondary amino group, a tertiary amino group, a heterocyclic ring containing an N atom, and an amide group. From the viewpoint of favorable adsorption power to magnetic particles and high dispersibility, the preferred basic group is a tertiary amino group. The resin A may contain one or two or more of these basic groups.

In a case where the resin A contains a repeating unit containing a basic group, the content of the repeating unit containing a basic group is preferably 0.01% to 50% by mass and more preferably 0.01% to 30% by mass with respect to the total mass of the resin A in terms of mass.

Examples of the coordinating group and the functional group having reactivity, which are functional groups capable of forming an interaction with magnetic particles, include an acetylacetoxy group, a trialkoxysilyl group, an isocyanate group, an acid anhydride, and an acid chloride. From the viewpoint of favorable adsorption power to magnetic particles and high dispersibility of magnetic particles, the preferred functional group is an acetylacetoxy group. The resin A may have one or two or more of these groups.

In a case where the resin A contains a repeating unit containing a coordinating group or a repeating unit containing a functional group having reactivity, the content of the repeating unit containing a coordinating group or the repeating unit containing a functional group having reactivity is preferably 10% to 80% by mass and more preferably 20% to 60% by mass with respect to the total mass of the resin A in terms of mass.

Ethylenically Unsaturated Group

The resin A may contain an ethylenically unsaturated group.

The ethylenically unsaturated group is not particularly limited, and examples thereof include a (meth)acryloyl group, a vinyl group, and a styryl group, among which a (meth)acryloyl group is preferable.

Above all, the resin A preferably contains a repeating unit containing an ethylenically unsaturated group in the side chain, and more preferably a repeating unit containing an ethylenically unsaturated group in the side chain and derived from (meth)acrylate (hereinafter, also referred to as "(meth)acrylic repeating unit containing an ethylenically unsaturated group in the side chain").

The (meth)acrylic repeating unit containing an ethylenically unsaturated group in the side chain is obtained, for example, by subjecting a carboxylic acid group in the resin A containing a (meth)acrylic repeating unit containing a carboxylic acid group to an addition reaction with an ethylenically unsaturated compound containing a glycidyl group or an alicyclic epoxy group. A (meth)acrylic repeating unit containing an ethylenically unsaturated group in the side chain can be obtained by reacting the ethylenically unsaturated group (glycidyl group or alicyclic epoxy group) thus introduced.

In a case where the resin A contains a repeating unit containing an ethylenically unsaturated group, the content of the repeating unit containing an ethylenically unsaturated group is preferably 30% to 70% by mass and more preferably 40% to 60% by mass with respect to the total mass of the resin A in terms of mass.

Other Repeating Units

Further, for the purpose of improving various performances such as a film forming ability, the resin A may further have other repeating units having various functions, which are different from the repeating unit containing a graft chain, the hydrophobic repeating unit, and the repeating unit containing a functional group capable of forming an interaction with magnetic particles, as long as the effect of the present invention is not impaired.

Examples of such other repeating units include repeating units derived from a radically polymerizable compound selected from acrylonitriles, methacrylonitriles, and the like.

One or two or more of these other repeating units can be used in the resin A, and the content thereof is preferably 0% to 80% by mass and more preferably 10% to 60% by mass with respect to the total mass of the resin A in terms of mass.

Physical Properties of Resin A

The acid value of the resin A is not particularly limited, and is, for example, preferably 0 to 400 mgKOH/g, more preferably 10 to 350 mgKOH/g, still more preferably 30 to 300 mgKOH/g, and particularly preferably 50 to 200 mgKOH/g.

In a case where the acid value of the resin A is 50 mgKOH/g or more, the precipitation stability of the magnetic particles can be further improved.

In the present specification, the acid value can be calculated, for example, from an average content of acid groups in a compound. In addition, a resin having a desired acid value can be obtained by changing the content of the repeating unit containing an acid group in the resin.

The weight-average molecular weight of the resin A is not particularly limited, and is, for example, preferably 3,000 or more, more preferably 4,000 or more, still more preferably 5,000 or more, and particularly preferably 6,000 or more. In addition, the upper limit value of the weight-average molecular weight of the resin A is, for example, preferably 300,000 or less, more preferably 200,000 or less, still more preferably 100,000 or less, and particularly preferably 50,000 or less.

The resin A can be synthesized based on a known method.

<Alkali-Soluble Resin>

The resin may include an alkali-soluble resin. In the present specification, the alkali-soluble resin means a resin containing a group that promotes alkali solubility (an alkali-soluble group, for example, an acid group such as a carboxylic acid group), and means a resin different from the resin A described above.

The alkali-soluble resin may be, for example, a resin containing at least one alkali-soluble group in the molecule, examples of which include a polyhydroxystyrene resin, a polysiloxane resin, a (meth)acrylic resin, a (meth)acrylamide resin, a (meth)acryl/(meth)acrylamide copolymer, an epoxy resin, and a polyimide resin.

Specific examples of the alkali-soluble resin include a copolymer of an unsaturated carboxylic acid and an ethylenically unsaturated compound.

The unsaturated carboxylic acid is not particularly limited, and examples thereof include monocarboxylic acids such as (meth)acrylic acid, crotonic acid, and vinylacetic acid; dicarboxylic acids such as itaconic acid, maleic acid, and fumaric acid, or acid anhydrides thereof; and polyvalent carboxylic acid monoesters such as mono-(2-(meth)acryloyloxyethyl) phthalate.

The copolymerizable ethylenically unsaturated compound may be, for example, methyl (meth)acrylate. In addition, the compounds described in paragraph [0027] of JP2010-097210A, the entire contents of which are incorporated herein by reference, and the compounds described in paragraphs [0036] and [0037] of JP2015-068893A, the entire contents of which are incorporated herein by reference, can also be used.

In addition, a copolymerizable ethylenically unsaturated compound which contains an ethylenically unsaturated group in the side chain may be used in combination. That is, the alkali-soluble resin may contain a repeating unit containing an ethylenically unsaturated group in the side chain.

The ethylenically unsaturated group contained in the side chain is preferably a (meth)acrylic acid group.

The repeating unit containing an ethylenically unsaturated group in the side chain is obtained, for example, by subjecting a carboxylic acid group of a (meth)acrylic repeating unit containing a carboxylic acid group to an addition reaction with an ethylenically unsaturated compound containing a glycidyl group or an alicyclic epoxy group.

An alkali-soluble resin containing a curable group is also preferable as the alkali-soluble resin.

Examples of the curable group include, but are not limited to, an ethylenically unsaturated group (for example, a (meth)acryloyl group, a vinyl group, or a styryl group), and a cyclic ether group (for example, an epoxy group or an oxetanyl group).

Above all, from the viewpoint that polymerization can be controlled by a radical reaction, the curable group is preferably an ethylenically unsaturated group and more preferably a (meth)acryloyl group.

An alkali-soluble resin having a curable group in the side chain or the like is preferable as the alkali-soluble resin containing a curable group. Examples of the alkali-soluble resin containing a curable group include DIANAL (registered trademark) NR series (manufactured by Mitsubishi Chemical Corporation), PHOTOMER 6173 (a polyurethane acrylic oligomer containing COOH, manufactured by Diamond Shamrock Co., Ltd.), VISCOAT R-264 and KS RESIST 106 (both of which are manufactured by Osaka Organic Chemical Industry Ltd.), CYCLOMER P series (for example, ACA230AA) and PLACCEL CF200 series (both of which are manufactured by DAICEL Corporation), EBECRYL 3800 (manufactured by Daicel-Allnex Ltd.), and ACRYCURE RD-F8 (manufactured by Nippon Shokubai Co., Ltd.).

A polyimide precursor can also be used as the alkali-soluble resin. The polyimide precursor means a resin obtained by subjecting a compound containing an acid anhydride group and a diamine compound to an addition polymerization reaction at a temperature of 40° C. to 100° C.

The acid value of the alkali-soluble resin is not particularly limited, and is preferably 30 to 500 mgKOH/g and more preferably 50 to 200 mgKOH/g or more.

In a case where the composition contains an alkali-soluble resin, the content of the alkali-soluble resin is preferably 0.1% to 40% by mass, more preferably 0.5% to 30% by mass, and still more preferably 1% to 20% by mass with respect to the total mass of the composition.

[Solvent]

The composition may contain a solvent. Examples of the solvent include water and an organic solvent, among which an organic solvent is preferable.

From the viewpoint of coatability, the boiling point of the solvent is preferably 100° C. to 400° C., more preferably 150° C. to 300° C., and still more preferably 170° C. to 250° C. In the present specification, the boiling point means a standard boiling point unless otherwise specified.

Examples of the organic solvent include, but are not limited to, acetone, methyl ethyl ketone, cyclohexane, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 1,4-butanediol diacetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, ethyl acetate, butyl acetate, methyl lactate, N-methyl-2-pyrrolidone, and ethyl lactate.

From the viewpoint that the effect of the present invention is more excellent, the content of the solvent is preferably 1% to 60% by mass, more preferably 2% to 50% by mass, and still more preferably 3% to 40% by mass with respect to the total mass of the composition.

[Polymerization Initiator]

The composition may contain a polymerization initiator.

The polymerization initiator is not particularly limited, and a known polymerization initiator can be used. Examples of the polymerization initiator include a photopolymerization initiator and a thermal polymerization initiator, among which a photopolymerization initiator is preferable. The polymerization initiator is preferably a so-called radical polymerization initiator.

The content of the polymerization initiator in the composition is not particularly limited, and is preferably 0.5% to 15% by mass, more preferably 1.0% to 10% by mass, and still more preferably 1.5% to 8.0% by mass with respect to the total solid content of the composition.

In a case where the composition is a positive type photosensitive composition, it is preferable that the composition contains a novolac resin and a quinonediazide group-containing compound.

The novolac resin is a resin obtained by condensing phenols and aldehydes using an acid catalyst. Examples of the novolac resin include a phenol novolac resin, a cresol novolac resin, a xylinol novolac resin, a resorcinol novolac resin, and a naphthol novolac resin.

The quinonediazide group-containing compound can have, for example, a 1,2-quinonediazide group or a 1,2-naphthoquinonediazide group as a quinonediazide group.

[Other Optional Components]

The composition may further contain optional components other than the above-mentioned components. Examples of other optional components include a surfactant, a polymerization inhibitor, an antioxidant, a sensitizer, a co-sensitizer, a crosslinking agent (a curing agent, for example, hexamethoxymethylmelamine), a curing accelerator, a heat curing accelerator, a plasticizer, a diluent, an oil sensitizer, and a rubber component. Further, known additives such as an adhesion promoter to a substrate surface and other auxiliary agents (for example, an anti-foaming agent, a flame retardant, a leveling agent, a peeling accelerator, an antioxidant, a fragrance, a surface tension adjuster, and a chain transfer agent) may be added, if necessary.

<<Surfactant>>

Examples of the surfactant include various surfactants such as a fluorine-based surfactant, a nonionic surfactant, a cationic surfactant, an anionic surfactant, and a silicone-based surfactant. Examples of the surfactant include the surfactants described in paragraphs [0238] to [0245] of WO2015/166779A, the entire contents of which are incorporated herein by reference.

[Method for Manufacturing Structure]

The method for manufacturing a structure according to the embodiment of the present invention includes the following step 1 and step 2.

Step 1: a step of forming a composition layer by applying a photosensitive composition containing magnetic particles onto a substrate on which a plurality of passive elements are disposed, a substrate before a plurality of passive elements are disposed, or the like Step 2: a step of subjecting the composition layer to an exposure treatment and a development treatment to form an electromagnetic wave absorbing film Hereinafter, the procedures of the step 1 and the step 2 will be described in detail.

[Step 1]

In the step 1, a photosensitive composition containing magnetic particles is applied onto a substrate on which a plurality of passive elements are disposed, a substrate before a plurality of passive elements are disposed, or the like to form a composition layer. With regard to the formation position of the composition layer, the composition layer can be formed at the position shown in the manufacturing method of each example of the structure described above.

The composition used is as described above.

A method of applying the composition is not particularly limited, and examples thereof include various application methods such as a slit coating method, an ink jet method, a spin coating method, a cast coating method, a roll coating method, and a screen printing method.

After the application of the composition, a drying treatment may be carried out, if necessary. The drying (pre-baking) can be carried out, for example, in a hot plate, an oven, or the like at a temperature of 50° C. to 140° C. for 10 to 1,800 seconds.

The film thickness of the composition layer is preferably 1 to 10,000 μm, more preferably 10 to 1,000 μm, and still more preferably 15 to 800 μm.

(Step 2)

The step 2 is a step of subjecting the composition layer to an exposure treatment and a development treatment to form an electromagnetic wave absorbing film.

The method of the exposure treatment is not particularly limited, and it is preferable to irradiate the composition layer with light through a photo mask having a patterned opening portion. The patterned opening portion of the photo mask is disposed such that the electromagnetic wave absorbing film having a predetermined shape described above is formed.

The exposure is preferably carried out by irradiation with radiation. The radiation that can be used for exposure is preferably ultraviolet rays such as g-line, h-line, and i-line, and a high-pressure mercury lamp is preferable as a light source. The irradiation intensity is preferably 5 to 1,500 mJ/cm$^2$ and more preferably 10 to 1,000 mJ/cm$^2$.

It is preferable to carry out a heat treatment (post-baking) after the exposure treatment.

The post-baking is a heat treatment after the development to complete curing. The heating temperature is preferably 240° C. or lower and more preferably 220° C. or lower. The lower limit of the heating temperature is not particularly limited, and is preferably 50° C. or higher and more preferably 100° C. or higher in consideration of efficient and effective treatment.

The post-baking can be carried out in a continuous or batchwise manner using a heating unit such as a hot plate, a convection oven (hot air circulation type dryer), or a high frequency heater.

The type of developer used in the development treatment is not particularly limited, and an alkali developer that does not cause damage to a circuit or the like is desirable.

The development temperature is, for example, 20° C. to 30° C.

The development time is, for example, 20 to 90 seconds. In recent years, the development treatment is sometimes carried out for 120 to 180 seconds in order to remove residues better. Further, in order to further improve the residue removability, a step of shaking off the developer every 60 seconds and then supplying a new developer may be repeated several times.

The alkali developer is preferably an alkaline aqueous solution prepared by dissolving an alkaline compound in water so that the concentration of the alkaline compound is 0.001% to 10% by mass (preferably 0.01% to 5% by mass).

Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, and 1,8-diazabicyclo[5.4.0]-7-undecene (among which organic alkalis are preferable).

In a case where the alkali developer is used, the development is generally followed by a washing treatment with water.

The present invention is basically configured as described above. Although the structure, the method for manufacturing a structure, and the composition according to the embodiment of the present invention have been described in detail above, the present invention is not limited to the above-mentioned embodiments, and various modifications or changes can be made without departing from the spirit and scope of the present invention.

EXAMPLES

The features of the present invention will be described in more detail with reference to the following examples. The materials, reagents, amounts and ratios of substances, operations, and the like shown in the following examples can be appropriately changed without departing from the spirit and scope of the present invention. Therefore, the scope of the present invention should not be construed as being limited to the following examples.

In the present example, a configuration is used in which an inductor 14 (see FIG. 1) and an inductor 12 (see FIG. 1) are disposed spaced apart from each other on a substrate. The size of the substrate was set to 700 μm×300 μm.

The inductor 14 was set to have an octagonal outer shape with a maximum outer width of 110 μm and a maximum inner width of 80 μm. The inductor 14 has an opening portion having a shape similar to the outer shape of the inductor 14, and the opening portion is of an octagonal shape. The maximum width of the opening portion was set to 56 μm.

The strip-shaped member of the inductor 14 was set to have a thickness of 2 μm and a width of 15 μm.

The width of an input portion of the inductor 14 was set to 20 μm. The number of turns of the inductor 14 was set to 1.75, and a gap between the turns was set to 5 μm. The resonance frequency of the inductor 14 is 60 GHz.

The inductor 12 was set to have an octagonal outer shape with a maximum outer width of 110 μm and a maximum inner width of 80 μm. The strip-shaped member of the inductor 12 was set to have a thickness of 2 μm and a width of 15 μm. The inductor 12 has an opening portion having a shape similar to the outer shape of the inductor 12, and the opening portion is of an octagonal shape. The maximum width of the opening portion was set to 56 μm.

A distance between the center of the opening portion of the inductor 14 and the center of the opening portion of the inductor 12 was set to 125 μm.

Both the inductor 14 and the inductor 12 were disposed at a position of 6.7 μm from the surface of the substrate.

[Electric Field Attenuation and Magnetic Field Attenuation]

In Examples 1 to 30 and Comparative Examples 1 to 3, an electric field and a magnetic field generated by a high-frequency wave generated in a case where a high frequency signal having a frequency of 60 GHz was supplied to the inductor 14 were measured at the position of the inductor 12.

Further, the electric field and the magnetic field were each evaluated based on the volume of the electromagnetic wave absorbing film.

The electric field attenuation and the magnetic field attenuation were calculated in units of decibel (dB) as integrated values of the electric field and the magnetic field at a position 125 μm apart in a case where a high-frequency signal having a frequency of 60 GHz was supplied to the inductor 14. The calculated value is a negative value. The position 125 μm apart corresponds to a position at the center of the opening portion of the inductor.

The integrated values of the electric field and the magnetic field were calculated by solving the Helmholtz wave equation shown in the following mathematical expression (a) and mathematical expression (b) using the RF module of COMSOL Multiphysics (registered trademark) and the physical study of electromagnetic waves (frequency domain).

In the following mathematical expression (a) and mathematical expression (b), j represents an imaginary number. In the mathematical expression (a) and the mathematical expression (b), $\varepsilon_r = \varepsilon' - \varepsilon'' \times j$, where $\varepsilon'$ is a real part of a dielectric constant and $\varepsilon''$ is an imaginary part of the dielectric constant.

$\mu_r = \mu' - \mu'' \times j$, where $\mu'$ is a real part of a magnetic permeability and $\mu''$ is an imaginary part of the magnetic permeability.

$k_0 = \omega(\mu_0 \cdot \varepsilon_0)^{1/2}$ (m$^{-1}$), where $\omega$ is an angular velocity, i is a current, $\mu_0$ is a magnetic permeability in vacuum, and $\varepsilon_0$ is a dielectric constant in vacuum. $\eta_0 = (\mu_0 \cdot \varepsilon_0)^{1/2}$ (Ω)

$\mu_0 = 1.257 \times 10^{-6}$ (H/m), and $\varepsilon_0 = 8.854 \times 10^{-12}$ (F/m).

$$\nabla \times \left(\frac{\nabla \times E}{\mu_r}\right) - k_0^2 \varepsilon_r E = -jk_0 \eta_0 i \tag{a}$$

$$\nabla \times \left(\frac{\nabla \times H}{\varepsilon_r}\right) - k_0^2 \mu_r H = \nabla \times \left(\frac{i}{\varepsilon_r}\right) \tag{b}$$

A value obtained by dividing the integrated value (dB) of the electric field by the volume (mm$^3$) of the electromagnetic wave absorbing film was evaluated according to the following evaluation standards.

In addition, a value obtained by dividing the integrated value (dB) of the magnetic field by the volume (mm$^3$) of the electromagnetic wave absorbing film was evaluated according to the following evaluation standards.

Evaluation Standards
A: less than −3,000 (dB/mm$^3$)
B: −3,000 or more and less than −150 (dB/mm$^3$)
C: −150 or more and less than −10 (dB/mm$^3$)
D: −10 or more (dB/mm$^3$)

For Examples 21, 22, 23, 24, and 27 to 30, the above measurement was carried out by changing the frequency from 60 GHz to 47 GHz and 28 GHz, as shown in Tables 10 and 11, respectively.

[Adjacent Disposition of Electromagnetic Wave Absorbing Film]

Upon assuming that the case where an electromagnetic wave absorbing film can be formed at a predetermined position with respect to the inductor 12 and the inductor 14 is regarded as "can be disposed adjacent to", it is described as "Possible to be disposed" in Tables 7 to 12 which will be given later.

On the other hand, assuming that the case where an electromagnetic wave absorbing film cannot be formed at a predetermined position with respect to the inductor 12 and the inductor 14 is regarded as "cannot be disposed adjacent to", it is described as "Not possible to be disposed" in Tables 7 to 12 which will be given later.

Examples 1 to 30 and Comparative Examples 1 to 3

Various components shown in Tables 1 to 6 were mixed to prepare each composition.
The individual components used are as follows.
(Magnetic Particles)
Barium Ferrite-1: Synthesized by the Following Method
400.0 g of water kept at a liquid temperature of 35° C. was stirred, and then a raw material aqueous solution prepared by dissolving 57.0 g of iron (III) chloride hexahydrate [$FeCl_3 \cdot 6H_2O$], 25.4 g of barium chloride dihydrate [$BaCl_2 \cdot 2H_2O$], and 10.2 g of aluminum chloride hexahydrate [$AlCl_3 \cdot 6H_2O$] in 216.0 g of water, and a solution prepared by adding 113.0 g of water to 181.3 g of a sodium hydroxide aqueous solution having a concentration of 5 mol/L were all added to the water being stirred at a flow rate of 10 mL/min at the same timing of addition to obtain a first liquid.

Next, the liquid temperature of the first liquid was set to 25° C., and then 39.8 g of a sodium hydroxide aqueous solution having a concentration of 1 mol/L was added thereto in a state where the liquid temperature was kept at that temperature to obtain a second liquid. The pH of the obtained second liquid was 10.5±0.5. The pH was measured using a desktop pH meter (F-71, manufactured by Horiba, Ltd.).

Next, the second liquid was stirred for 15 minutes to obtain a liquid containing a precipitate serving as a precursor of magnetoplumbite type hexagonal ferrite (precursor-containing liquid).

Next, the precursor-containing liquid was subjected to a centrifugation treatment (rotation speed: 2,000 revolutions per minute (rpm), rotation time: 10 minutes) three times, and the resulting precipitate was recovered and washed with water.

Next, the recovered precipitate was dried in an oven having an internal atmospheric temperature of 95° C. for 12 hours to obtain a powder of the precursor.

Next, the powder of the precursor was placed in a muffle furnace, the temperature in the furnace was set to 1,100° C., and the powder of the precursor was fired for 4 hours in an air atmosphere to obtain a lumpy sintered product.

Next, the obtained sintered product was pulverized for 90 seconds using a cutter mill (WONDER CRUSHER WC-3, manufactured by Osaka Chemical Co., Ltd.) as a crusher, setting a variable speed dial of the crusher to "5" (rotation speed: about 10,000 to 15,000 rpm) to obtain a magnetic powder (barium ferrite-1).

The crystal structure of the magnetic material constituting each of the above-mentioned magnetic powders was identified by X-ray diffraction analysis. An X'Pert Pro (manufactured by Malvern Panalytical Ltd.), which is a powder X-ray diffractometer, was used as a measurement device. The measurement conditions are shown below.

—Measurement Conditions—
X-ray source: CuKα ray
[wavelength: 1.54 Å (0.154 nm), output: 40 mA, 45 kV]
Scan range: $20° < 2\theta < 70°$
Scan interval: 0.05°
Scan speed: 0.75°/min As a result of the X-ray diffraction analysis, it was confirmed that the obtained magnetic powder was a powder of single-phase magnetoplumbite type hexagonal ferrite having a magnetoplumbite type crystal structure, and containing no crystal structure other than the magnetoplumbite type crystal structure.

Barium Ferrite-2: Synthesized by the Following Method
A fine particle pulverization step was carried out using a magnetic material BMXF-5 (manufactured by Beijing General Research Institute of Mining & Metallurgy (BGRIMM)).

Specifically, the above magnetic powder (50 g), water (100 g), and zirconium beads (500 g) having a diameter of 1 mm were placed in a 250 ml shaker plastic bottle (with a Teflon (registered trademark) seal on the mouth) and stirred for 18 hours with a paint shaker. The mixed contents were filtered through a nylon mesh PA-77 (manufactured by AS ONE Corporation), and the filtrate was recovered. After washing with water several times, the supernatant water was removed, followed by drying in a dry oven at 80° C. for 8.5 hours to obtain barium ferrite-2.

Barium Ferrite-3: Synthesized by the Following Method
Using a magnetic material MC-617 (manufactured by Toda Kogyo Corporation), a microparticulation step was carried out in the same manner as in the case of barium ferrite-2 to obtain barium ferrite-3.

Strontium Ferrite: Synthesized by the Following Method
46.3 g of strontium carbonate [$SrCO_3$, manufactured by FUJIFILM Wako Pure Chemical Corporation], 255.1 g of α-iron oxide (III) [$\alpha\text{-}Fe_2O_3$, manufactured by FUJIFILM Wako Pure Chemical Corporation], and 14.8 g of aluminum oxide [$Al_2O_3$, manufactured by FUJIFILM Wako Pure Chemical Corporation, average particle size: 40 nm] were stirred for 2 minutes using Wonder Crush/Mill (Model: WDL-1, manufactured by Osaka Chemical Co., Ltd.).

300 g of water and 30.0 g of flux (strontium chloride hexahydrate [$SrCl_2 \cdot 6H_2O$, manufactured by FUJIFILM Wako Pure Chemical Corporation]) were added to the obtained mixture which was then stirred for 30 minutes with a Waring blender (Model: 7011HSJ, manufactured by Waring Laboratory Science) and dried in a drying device with an internal atmosphere temperature of 95° C.

Next, using the Wonder Crush/Mill, the dried mixture was stirred and pulverized for 2 minutes to obtain a precursor of a magnetic powder. The obtained precursor was placed in a muffle furnace, and the temperature inside the furnace was set to a temperature condition of 1250° C. in an atmospheric atmosphere, followed by firing for 4 hours to obtain a sintered product. The obtained sintered product was stirred and pulverized for 2 minutes using the Wonder Crush/Mill, repeatedly washed with water, and then dried in a drying device with an internal atmospheric temperature of 95° C.

This was followed by stirring and pulverization for 2 minutes using the Wonder Crush/Mill to obtain a magnetic powder.

Rare earth-iron-nitrogen-based magnetic material: synthesized by the method described in WO2008/136391A.

Yttrium-containing ferrite: pulverized to a particle diameter of 3 μm after casting by the method described in "Powder and Powder Metallurgy", Vol. 50, No. 1, pp. 63 to 67.

Epsilon type iron oxide: synthesized by the method described in JP2016-111341A.

Fe—Mn-based ferrite: synthesized by the following method.

Using a magnetic material MOSS (manufactured by Powdertech Co., Ltd.), a microparticulation step was carried out in the same manner as in the case of barium ferrite-2 to obtain Fe—Mn-based ferrite. The average primary particle diameter of the Fe—Mn-based ferrite particles was 100 nm.

Ni—Fe-based magnetic material: synthesized by the following method.

It is a nickel-iron alloy powder with a compositional ratio of Ni: 87% and Fe: 13%, produced by a vapor phase reduction method. The average primary particle diameter of the Ni—Fe-based magnetic material was 100 nm.

Nickel-zinc ferrite: synthesized by the method described in JP2001-053483A.

(Dispersing Agent)

X-1: a resin represented by the following structural formula. The numerical value in each repeating unit in the following formulae represents the content (% by mass) of each repeating unit with respect to all the repeating units.

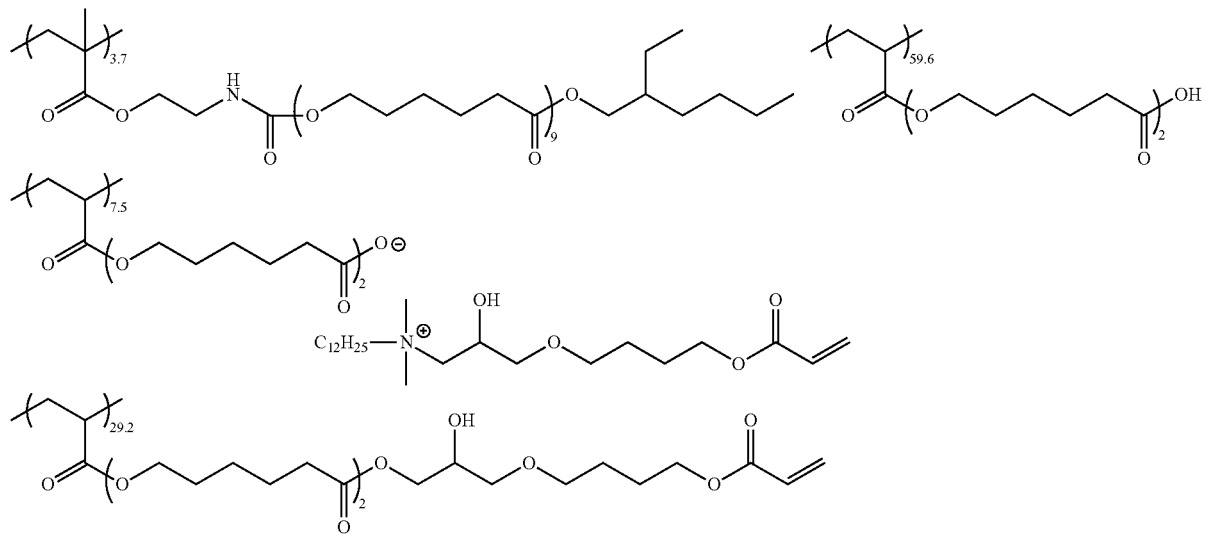

X-2: a resin represented by the following structural formula. The numerical value in each repeating unit in the following formulae represents the content (% by mass) of each repeating unit with respect to all the repeating units.

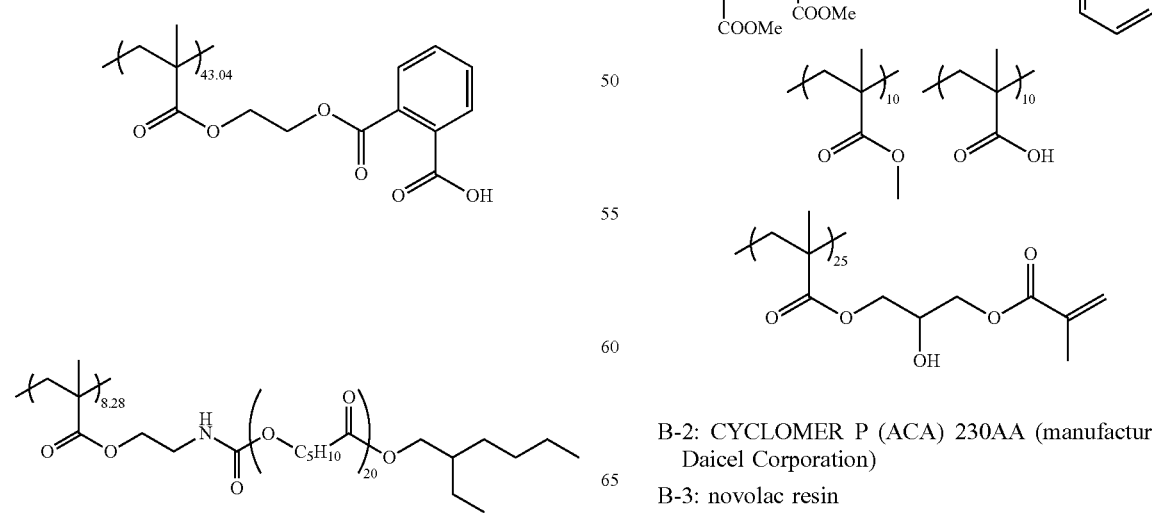

(Resin)

B-1: a resin represented by the following structural formula. The numerical value in each repeating unit in the following formulae represents the content (% by mass) of each repeating unit with respect to all the repeating units.

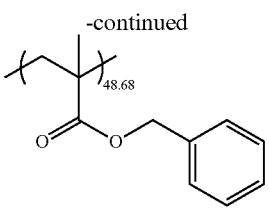

B-2: CYCLOMER P (ACA) 230AA (manufactured by Daicel Corporation)

B-3: novolac resin

The B-1 and B-2 correspond to an alkali-soluble resin.

(Polymerizable Compound)
  KAYARAD DPHA (a mixture of dipentaerythritol hexaacrylate and dipentaerythritol pentaacrylate, manufactured by Nippon Kayaku Co., Ltd.)
  KAYARAD RP-1040 (tetrafunctional acrylate, manufactured by Nippon Kayaku Co., Ltd.)
  NK ESTER A-TMMT (polyfunctional acrylate, manufactured by Shin-Nakamura Chemical Co., Ltd.)
  Hexamethoxymethylmelamine (manufactured by Sanwa Chemical Co., Ltd.)
(Polymerization Initiator)
  IRGACURE OXE-01 (an oxime ester-based initiator, manufactured by BASF Japan Ltd.)
  Compound (1) having the following structure

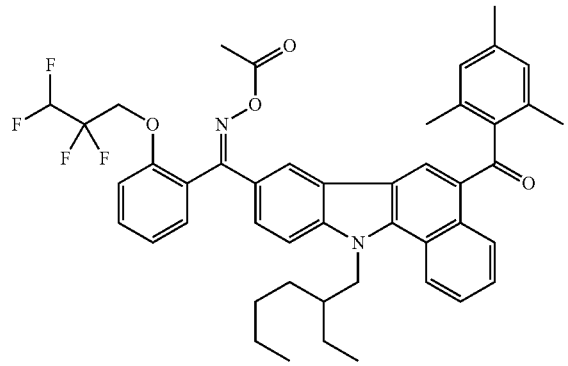

(1)

(Photosensitive Material)
  Benzophenone derivative: 2,3,4-trihydroxybenzophenone-1,2-naphthoquinonediazide-5-sulfonic acid ester (2S: two out of three hydroxyl groups are substituted, one is H) described in paragraph [0037] of JP2002-040651A
(Antioxidant)
  p-Methoxyphenol (manufactured by Sanritsu Chemy Co., Ltd.)
  ADEKA STAB AO-80 (a compound having the following structure, manufactured by ADEKA Corporation)

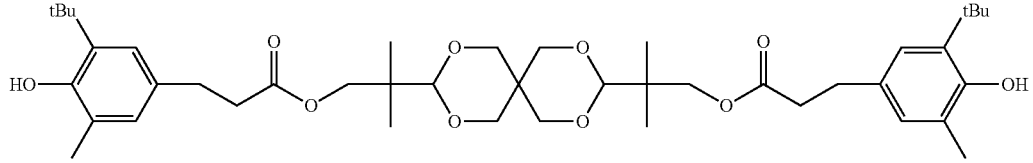 [SMILES: Cc1cc(CCC(=O)OCC(C)(C)C2OCC3(CO2)COC(C(C)(C)COC(=O)CCc2cc(C)c(O)c(C(C)(C)C)c2)OC3)cc(C(C)(C)C)c1O]

(Surfactant)
  KF-6001 (both-terminal carbinol-modified polydimethylsiloxane, hydroxyl value: 62 mgKOH/g, manufactured by Shin-Etsu Chemical Co., Ltd.)
  POLYFOX PF6320 (a fluorine-based surfactant, manufactured by OMNOVA Solutions Inc.)
(Solvent)
Propylene Glycol Monomethyl Ether Acetate (PGMEA)

The composition prepared above was applied onto a substrate on which the inductor 12 and the inductor 14 were disposed to form a composition layer. Then, the composition layer was subjected to a drying treatment at 100° C. for 2 minutes. As for the thickness of the composition layer, the application amount of the composition was adjusted so that the film thickness of the electromagnetic wave absorbing film shown in Table 1 was 30 μm. The substrate was a silicon substrate.

Next, the composition layer was subjected to an exposure treatment under the condition of 10 mJ/cm² with a USHIO simple exposure device through a mask having a predetermined opening portion so that an electromagnetic wave absorbing film as shown in FIG. 8 was formed. The disposition of the electromagnetic wave absorbing film in each of the opening portions of the inductor 12 and the inductor 14, as shown in FIG. 8, is described as "Inside" in Tables 1 to 6 which will be given later.

The exposure was followed by a shower development treatment at 23° C. for 60 seconds using a simple development device (manufactured by Mikasa Corporation). An aqueous solution having a content of tetramethylammonium hydroxide (TMAH) of 0.3% by mass was used as the developer.

After the development, a spin shower rinsing treatment with pure water was carried out, followed by spin drying and then a heat treatment (post-baking) for 5 minutes using a hot plate at 220° C. to form an electromagnetic wave absorbing film having a predetermined shape.

Examples 2 to 30

A structure having a magnetic pattern portion was manufactured in the same manner as in Example 1, except that various conditions such as a type of pattern, an average primary particle diameter of magnetic particles, and a film thickness of a magnetic pattern portion were changed as shown in Tables 1 to 6 which will be given later.

The results of each of Examples are summarized in the tables which will be given later.

Examples 2 to 9 were the same as Example 1, with the disposition of the electromagnetic wave absorbing film being the disposition of the electromagnetic wave absorbing film shown in FIG. 8.

In Examples 10 and 11, the disposition of the electromagnetic wave absorbing film shown in FIG. 1 was adopted. The disposition of the electromagnetic wave absorbing film between the inductor 12 and the inductor 14, as shown in FIG. 1, is described as "Outside" in Tables 1 to 6 which will be given later.

In Examples 12 and 13, the disposition of the electromagnetic wave absorbing film shown in FIG. 10 was adopted. The disposition of the electromagnetic wave absorbing film shown in FIG. 10 is a combination of the disposition of the electromagnetic wave absorbing film shown in FIG. 1 and the disposition of the electromagnetic wave absorbing film shown in FIG. 8, and is described as "Inside+Outside" in Tables 1 to 6 which will be given later.

In Examples 14 and 15, the disposition of the electromagnetic wave absorbing film shown in FIG. 12 was adopted. The disposition of the electromagnetic wave absorbing film on the inductor 12 and the inductor 14, as shown in FIG. 12, is described as "On" in Tables 1 to 6 which will be given later.

In Examples 16 and 17, the disposition of the electromagnetic wave absorbing film shown in FIG. 15 was adopted. The disposition of the electromagnetic wave absorbing film under the substrate, the inductor 12, and the inductor 14, as shown in FIG. 15, is described as "Under" in Tables 1 to 6 which will be given later.

In Examples 18 to 20, the disposition of the electromagnetic wave absorbing film shown in FIG. 18 was adopted. The disposition of the electromagnetic wave absorbing film shown in FIG. 18 is a combination of the disposition of the electromagnetic wave absorbing film shown in FIG. 12 and the disposition of the electromagnetic wave absorbing film shown in FIG. 15, and is described as "On+Under" in Tables 1 to 6 which will be given later.

Examples 21 to 30 were the same as Example 1, with the disposition of the electromagnetic wave absorbing film being the disposition of the electromagnetic wave absorbing film shown in FIG. 8. In Examples 25, 27, and 29, there are two types of magnetic particles, the particle diameter of each of which is described in the column of the magnetic particle size. The particle diameter of the magnetic particles in the upper row is shown on the left side, and the particle diameter of the magnetic particles in the lower row is shown on the right side.

Comparative Examples 1 to 3

Comparative Example 1 was the same as Example 1, except that no magnetic particles were used. In Comparative Example 1, no electromagnetic wave absorbing film was formed because no magnetic particles were used.

Figure 22:
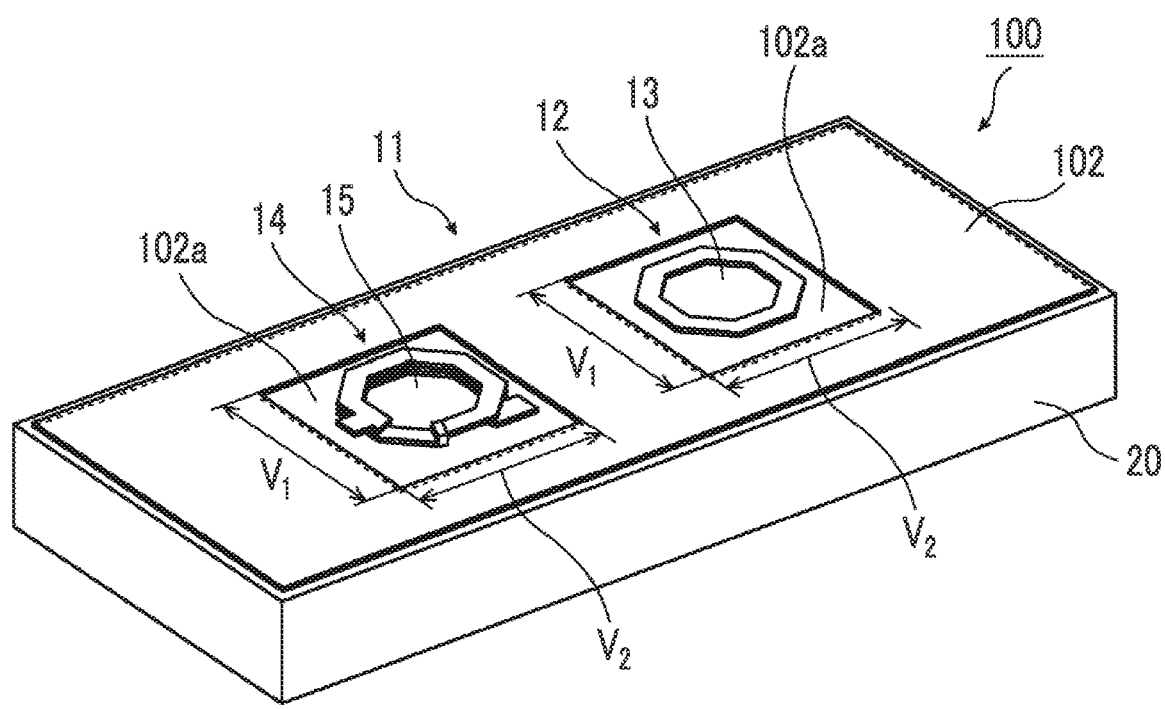
FIG. 22 is a schematic perspective view showing a structure of Comparative Example 2.

In Comparative Example 2, the electromagnetic wave absorbing film of Example 1 was configured of a copper layer 102 as in a structure 100 shown in FIG. 22. The copper layer 102 has a thickness of 10 µm, and has a quadrangular opening portion 102$a$ in a region of the inductor 12 and a region of the inductor 14. The size of the opening portion 102$a$ is $V_1 \times V_2$. $V_1$ was set to 165 µm, and $V_2$ was set to 155 µm.

The copper layer was formed by a device microfabrication technique by repeating steps such as lamination sputtering, photolithography, dry etching, plasma ashing, copper electrolytic plating, CMP slurry polishing, and wet etching.

In the structure 100 shown in FIG. 22, the same components as those of the structure 10 shown in FIG. 1 and FIG. 2 are denoted by the same reference numerals, and the detailed description thereof will be omitted.

Comparative Example 3 was the same as Example 1, except that nickel-zinc ferrite was used as the magnetic particles and the complex part µ" of the complex relative magnetic permeability µ was zero at frequencies of 60 GHz, 47 GHz, and 28 GHz.

The complex part µ" of the complex relative magnetic permeability µ of the electromagnetic wave absorbing film was measured as follows.

A vector network analyzer (product name: N5225B) manufactured by Keysight Technologies, Inc. and a horn antenna (product name: RH12S23, RH06S10) manufactured by Keycom Corporation are used as measurement devices. Subsequently, the complex part µ" of the complex relative magnetic permeability µ at a frequency of 60 GHz was obtained by measuring an S parameter every 0.1 GHz according to a free space method by setting an incidence angle to 0° and a sweep frequency band to 55.0 GHz to 95.0 GHz, with one plane of each of the above-mentioned electromagnetic wave absorbing films being directed toward an incident side. The complex part µ" of the complex relative magnetic permeability µ at frequencies of 28 GHz and 47 GHz was obtained by changing the sweep frequency band.

The column of "Size of magnetic particles" shown in Tables 1 to 6 represents an average primary particle diameter of the magnetic particles.

TABLE 1

|  |  | Example 1 | Example 2 | Example 3 | Example 4 | Example 5 | Example 6 |
|---|---|---|---|---|---|---|---|
| Magnetic particles | Barium ferrite-1 | 39.23 | 39.23 | 39.23 | 39.23 | 39.23 | 39.23 |
|  | Barium ferrite-2 |  |  |  |  |  |  |
|  | Barium ferrite-3 |  |  |  |  |  |  |
|  | Strontium ferrite |  |  |  |  |  |  |
|  | Rare earth-iron-nitrogen-based magnetic material |  |  |  |  |  |  |
|  | Yttrium-containing ferrite |  |  |  |  |  |  |
|  | Epsilon type iron oxide |  |  |  |  |  |  |
|  | Fe—Mn-based ferrite |  |  |  |  |  |  |
|  | Ni—Fe-based magnetic material |  |  |  |  |  |  |
|  | Nickel-zinc ferrite |  |  |  |  |  |  |
| Dispersing agent | X-1 | 7.06 | 7.06 | 7.06 |  | 7.06 | 7.06 |
|  | X-2 |  |  |  | 7.06 |  |  |
| Resin | B-1 | 3.24 | 1.74 | 4.24 |  | 3.24 | 3.24 |
|  | B-2 |  |  |  | 3.24 |  |  |
|  | B-3 |  |  |  |  |  |  |
| Polymerizable compound | KAYARAD DPHA | 15.05 | 16.55 | 14.05 | 15.05 |  |  |
|  | KAYARAD RP-1040 |  |  |  |  | 15.05 |  |
|  | NK ESTER A-TMMT |  |  |  |  |  | 15.05 |
|  | Hexamethoxymethylmelamine |  |  |  |  |  |  |
| Polymerization initiator | IRGACURE OXE-01 | 3.76 | 3.76 | 3.76 | 3.76 | 3.76 | 3.76 |
|  | Compound (1) |  |  |  |  |  |  |
| Photosensitive material | Benzophenone derivative |  |  |  |  |  |  |
|  | DNQ |  |  |  |  |  |  |

TABLE 1-continued

|  |  | Example 1 | Example 2 | Example 3 | Example 4 | Example 5 | Example 6 |
|---|---|---|---|---|---|---|---|
| Antioxidant | p-Methoxyphenol | 0.01 | 0.01 | 0.01 | 0.01 | 0.01 | 0.01 |
|  | ADEKA STAB AO-80 |  |  |  |  |  |  |
| Surfactant | KF-6001 | 0.04 | 0.04 | 0.04 | 0.04 | 0.04 | 0.04 |
|  | POLYFOX PF6320 |  |  |  |  |  |  |
| Solvent | PGMEA | 31.61 | 31.61 | 31.61 | 31.61 | 31.61 | 31.61 |
| Total (% by mass) |  | 100 | 100 | 100 | 100 | 100 | 100 |
| Disposition of electromagnetic wave absorbing film |  | Inside | Inside | Inside | Inside | Inside | Inside |
| Size of magnetic particles |  | 100 nm | 100 nm | 100 nm | 100 nm | 100 nm | 100 nm |
| Film thickness |  | 30 μm | 30 μm | 30 μm | 30 μm | 30 μm | 30 μm |
| μ" at 60 GHz |  | 0.48 | 0.48 | 0.48 | 0.48 | 0.48 | 0.48 |
| μ" at 47 GHz |  | 0 | 0 | 0 | 0 | 0 | 0 |
| μ" at 28 GHz |  | 0 | 0 | 0 | 0 | 0 | 0 |
| Application conditions |  | 100° C./ 2 minutes | 100° C./ 2 minutes | 100° C./ 2 minutes | 100° C./ 2 minutes | 100° C./ 2 minutes | 100° C./ 2 minutes |
| Exposure conditions |  | 10 mJ/cm² | 10 mJ/cm² | 10 mJ/cm² | 10 mJ/cm² | 10 mJ/cm² | 10 mJ/cm² |
| Development conditions |  | 60 seconds | 60 seconds | 60 seconds | 60 seconds | 60 seconds | 60 seconds |
| Baking conditions |  | 220° C./ 5 minutes | 220° C./ 5 minutes | 220° C./ 5 minutes | 220° C./ 5 minutes | 220° C./ 5 minutes | 220° C./ 5 minutes |

TABLE 2

|  |  | Example 7 | Example 8 | Example 9 | Example 10 | Example 11 | Example 12 |
|---|---|---|---|---|---|---|---|
| Magnetic particles | Barium ferrite-1 | 39.23 | 39.23 |  | 39.23 |  | 39.23 |
|  | Barium ferrite-2 |  |  |  |  |  |  |
|  | Barium ferrite-3 |  |  |  |  |  |  |
|  | Strontium ferrite |  |  | 39.23 |  | 39.23 |  |
|  | Rare earth-iron-nitrogen-based magnetic material |  |  |  |  |  |  |
|  | Yttrium-containing ferrite |  |  |  |  |  |  |
|  | Epsilon type iron oxide |  |  |  |  |  |  |
|  | Fe—Mn-based ferrite |  |  |  |  |  |  |
|  | Ni—Fe-based magnetic material |  |  |  |  |  |  |
|  | Nickel-zinc ferrite |  |  |  |  |  |  |
| Dispersing agent | X-1 | 7.06 | 7.06 | 7.06 | 7.06 | 7.06 | 7.06 |
|  | X-2 |  |  |  |  |  |  |
| Alkali-soluble resin | B-1 | 3.24 | 3.24 | 3.24 | 3.24 | 3.24 | 3.24 |
|  | B-2 |  |  |  |  |  |  |
|  | B-3 |  |  |  |  |  |  |
| Polymerizable compound | KAYARAD DPHA | 15.05 | 15.05 | 15.05 | 15.05 | 15.05 | 15.05 |
|  | KAYARAD RP-1040 |  |  |  |  |  |  |
|  | NK ESTER A-TMMT |  |  |  |  |  |  |
|  | Hexamethoxy-methylmelamine |  |  |  |  |  |  |
| Polymerization initiator | IRGACURE OXE-01 | 3.76 | 3.76 | 3.76 | 3.76 | 3.76 | 3.76 |
|  | Compound (1) |  |  |  |  |  |  |
| Photosensitive material | Benzophenone derivative |  |  |  |  |  |  |
|  | DNQ |  |  |  |  |  |  |
| Antioxidant | p-Methoxyphenol |  |  |  |  |  |  |
|  | ADEKA STAB AO-80 | 0.01 | 0.01 |  | 0.01 | 0.01 | 0.01 | 0.01 |
| Surfactant | KF-6001 | 0.04 |  |  | 0.04 | 0.04 | 0.04 | 0.04 |
|  | POLYFOX PF6320 |  | 0.04 |  |  |  |  |
| Solvent | PGMEA | 31.61 | 31.61 | 31.61 | 31.61 | 31.61 | 31.61 |
| Total (% by mass) |  | 100 | 100 | 100 | 100 | 100 | 100 |
| Disposition of electromagnetic wave absorbing film |  | Inside | Inside | Inside | Outside | Outside | Inside + Outside |
| Size of magnetic particles |  | 100 nm | 100 nm | 100 nm | 100 nm | 100 nm | 100 nm |
| Film thickness |  | 30 μm | 30 μm | 30 μm | 30 μm | 30 μm | 30 μm |
| μ" at 60 GHz |  | 0.48 | 0.48 | 0.49 | 0.48 | 0.49 | 0.48 |
| μ" at 47 GHz |  | 0 | 0 | 0 | 0 | 0 | 0 |
| μ" at 28 GHz |  | 0 | 0 | 0 | 0 | 0 | 0 |
| Application conditions |  | 100° C./ 2 minutes | 100° C./ 2 minutes | 100° C./ 2 minutes | 100° C./ 2 minutes | 100° C./ 2 minutes | 100° C./ 2 minutes |
| Exposure conditions |  | 10 mJ/cm² | 10 mJ/cm² | 10 mJ/cm² | 10 mJ/cm² | 10 mJ/cm² | 10 mJ/cm² |
| Development conditions |  | 60 seconds | 60 seconds | 60 seconds | 60 seconds | 60 seconds | 60 seconds |
| Baking conditions |  | 220° C./ 5 minutes | 220° C./ 5 minutes | 220° C./ 5 minutes | 220° C./ 5 minutes | 220° C./ 5 minutes | 220° C./ 5 minutes |

TABLE 3

|  |  | Example 13 | Example 14 | Example 15 | Example 16 | Example 17 | Example 18 |
|---|---|---|---|---|---|---|---|
| Magnetic particles | Barium ferrite-1 |  | 39.23 |  | 39.23 |  | 39.23 |
|  | Barium ferrite-2 |  |  |  |  |  |  |
|  | Barium ferrite-3 |  |  |  |  |  |  |
|  | Strontium ferrite | 39.23 |  | 39.23 |  | 39.23 |  |
|  | Rare earth-iron-nitrogen-based magnetic material |  |  |  |  |  |  |
|  | Yttrium-containing ferrite |  |  |  |  |  |  |
|  | Epsilon type iron oxide |  |  |  |  |  |  |
|  | Fe—Mn-based ferrite |  |  |  |  |  |  |
|  | Ni—Fe-based magnetic material |  |  |  |  |  |  |
|  | Nickel-zinc ferrite |  |  |  |  |  |  |
| Dispersing agent | X-1 | 7.06 | 7.06 | 7.06 | 7.06 | 7.06 | 7.06 |
|  | X-2 |  |  |  |  |  |  |
| Resin | B-1 | 3.24 | 3.24 | 3.24 | 3.24 | 3.24 | 3.24 |
|  | B-2 |  |  |  |  |  |  |
|  | B-3 |  |  |  |  |  |  |
| Polymerizable compound | KAYARAD DPHA | 15.05 | 15.05 | 15.05 | 15.05 | 15.05 | 15.05 |
|  | KAYARAD RP-1040 |  |  |  |  |  |  |
|  | NK ESTER A-TMMT |  |  |  |  |  |  |
|  | Hexamethoxy-methylmelamine |  |  |  |  |  |  |
| Polymerization initiator | IRGACURE OXE-01 | 3.76 | 3.76 | 3.76 | 3.76 | 3.76 | 3.76 |
|  | Compound (1) |  |  |  |  |  |  |
| Photosensitive material | Benzophenone derivative DNQ |  |  |  |  |  |  |
| Antioxidant | p-Methoxyphenol | 0.01 | 0.01 | 0.01 | 0.01 | 0.01 | 0.01 |
|  | ADEKA STAB AO-80 |  |  |  |  |  |  |
| Surfactant | KF-6001 | 0.04 | 0.04 | 0.04 | 0.04 | 0.04 | 0.04 |
|  | POLYFOX PF6320 |  |  |  |  |  |  |
| Solvent | PGMEA | 31.61 | 31.61 | 31.61 | 31.61 | 31.61 | 31.61 |
| Total (% by mass) |  | 100 | 100 | 100 | 100 | 100 | 100 |
| Disposition of electromagnetic wave absorbing film |  | Inside + Outside | On | On | Under | Under | On + Under |
| Size of magnetic particles |  | 100 nm | 100 nm | 100 nm | 100 nm | 100 nm | 100 nm |
| Film thickness |  | 30 μm | 30 μm | 30 μm | 30 μm | 30 μm | 30 μm |
| μ" at 60 GHz |  | 0.49 | 0.48 | 0.49 | 0.48 | 0.49 | 0.48 |
| μ" at 47 GHz |  | 0 | 0 | 0 | 0 | 0 | 0 |
| μ" at 28 GHz |  | 0 | 0 | 0 | 0 | 0 | 0 |
| Application conditions |  | 100° C./2 minutes | 100° C./2 minutes | 100° C./2 minutes | 100° C./2 minutes | 100° C./2 minutes | 100° C./2 minutes |
| Exposure conditions |  | 10 mJ/cm$^2$ | 10 mJ/cm$^2$ | 10 mJ/cm$^2$ | 10 mJ/cm$^2$ | 10 mJ/cm$^2$ | 10 mJ/cm$^2$ |
| Development conditions |  | 60 seconds | 60 seconds | 60 seconds | 60 seconds | 60 seconds | 60 seconds |
| Baking conditions |  | 220° C./5 minutes | 220° C./5 minutes | 220° C./5 minutes | 220° C./5 minutes | 220° C./5 minutes | 220° C./5 minutes |

TABLE 4

|  |  | Example 19 | Example 20 | Example 21 | Example 22 | Example 23 | Example 24 |
|---|---|---|---|---|---|---|---|
| Magnetic particles | Barium ferrite-1 |  | 39.23 |  |  |  |  |
|  | Barium ferrite-2 |  |  | 39.23 |  |  |  |
|  | Barium ferrite-3 |  |  |  | 39.23 |  |  |
|  | Strontium ferrite | 39.23 |  |  |  |  |  |
|  | Rare earth-iron-nitrogen-based magnetic material |  |  |  |  |  |  |
|  | Yttrium-containing ferrite |  |  |  |  |  |  |
|  | Epsilon type iron oxide |  |  |  |  |  |  |
|  | Fe—Mn-based ferrite |  |  |  |  | 39.23 |  |
|  | Ni—Fe-based magnetic material |  |  |  |  |  | 39.23 |
|  | Nickel-zinc ferrite |  |  |  |  |  |  |
| Dispersing agent | X-1 | 7.06 | 7.06 | 7.06 | 7.06 | 7.06 | 7.06 |
|  | X-2 |  |  |  |  |  |  |
| Resin | B-1 | 3.24 |  | 3.24 | 3.24 | 3.24 | 3.24 |
|  | B-2 |  |  |  |  |  |  |
|  | B-3 |  | 13.6 |  |  |  |  |

TABLE 4-continued

|  |  | Example 19 | Example 20 | Example 21 | Example 22 | Example 23 | Example 24 |
|---|---|---|---|---|---|---|---|
| Polymerizable compound | KAYARAD DPHA | 15.05 |  | 15.05 | 15.05 |  |  |
|  | KAYARAD RP-1040 |  |  |  |  | 15.05 | 15.05 |
|  | NK ESTER A-TMMT |  |  |  |  |  |  |
|  | Hexamethoxy-methylmelamine |  | 3.68 |  |  |  |  |
| Polymerization initiator | IRGACURE OXE-01 | 3.76 |  | 3.76 | 3.76 | 3.76 | 3.76 |
|  | Compound (1) |  |  |  |  |  |  |
| Photosensitive material | Benzophenone derivative DNQ |  | 4.77 |  |  |  |  |
| Antioxidant | p-Methoxyphenol | 0.01 | 0.01 | 0.01 | 0.01 | 0.01 | 0.01 |
|  | ADEKA STAB AO-80 |  |  |  |  |  |  |
| Surfactant | KF-6001 | 0.04 | 0.04 | 0.04 | 0.04 | 0.04 | 0.04 |
|  | POLYFOX PF6320 |  |  |  |  |  |  |
| Solvent | PGMEA | 31.61 | 31.61 | 31.61 | 31.61 | 31.61 | 31.61 |
| Total (% by mass) |  | 100 | 100 | 100 | 100 | 100 | 100 |
| Disposition of electromagnetic wave absorbing film |  | On + Under | On + Under | Inside | Inside | Inside | Inside |
| Size of magnetic particles |  | 100 nm | 100 nm | 100 nm | 100 nm | 100 nm | 100 nm |
| Film thickness |  | 30 μm | 30 μm | 30 μm | 30 μm | 30 μm | 30 μm |
| μ" at 60 GHz |  | 0.49 | 0.48 | 0 | 0 | 0 | 0 |
| μ" at 47 GHz |  | 0 | 0 | 0.70 | 0 | 0 | 0 |
| μ" at 28 GHz |  | 0 | 0 | 0 | 0.79 | 0.2 | 0.1 |
| Application conditions |  | 100° C./2 minutes | 100° C./2 minutes | 100° C./2 minutes | 100° C./2 minutes | 100° C./2 minutes | 100° C./2 minutes |
| Exposure conditions |  | 10 mJ/cm² | 10 mJ/cm² | 10 mJ/cm² | 10 mJ/cm² | 10 mJ/cm² | 10 mJ/cm² |
| Development conditions |  | 60 seconds | 60 seconds | 60 seconds | 60 seconds | 60 seconds | 60 seconds |
| Baking conditions |  | 220° C./5 minutes | 220° C./5 minutes | 220° C./5 minutes | 220° C./5 minutes | 220° C./5 minutes | 220° C./5 minutes |

TABLE 5

|  |  | Example 25 | Example 26 | Example 27 | Example 28 | Example 29 | Example 30 |
|---|---|---|---|---|---|---|---|
| Magnetic particles | Barium ferrite-1 |  |  |  |  |  |  |
|  | Barium ferrite-2 | 30.51 |  |  |  |  |  |
|  | Barium ferrite-3 |  |  | 32.98 |  |  |  |
|  | Strontium ferrite |  |  |  |  |  |  |
|  | Rare earth-iron-nitrogen-based magnetic material |  |  |  |  | 3.09 | 39.23 |
|  | Yttrium-containing ferrite |  |  | 6.25 | 39.23 |  |  |
|  | Epsilon type iron oxide | 8.72 | 39.23 |  |  |  |  |
|  | Fe—Mn-based ferrite |  |  |  |  | 36.14 |  |
|  | Ni—Fe-based magnetic material |  |  |  |  |  |  |
|  | Nickel-zinc ferrite |  |  |  |  |  |  |
| Dispersing agent | X-1 | 7.06 | 7.06 | 7.06 | 7.06 | 7.06 | 7.06 |
|  | X-2 |  |  |  |  |  |  |
| Resin | B-1 | 3.24 | 3.24 | 3.24 | 3.24 | 3.24 | 3.24 |
|  | B-2 |  |  |  |  |  |  |
|  | B-3 |  |  |  |  |  |  |
| Polymerizable compound | KAYARAD DPHA |  |  |  |  |  |  |
|  | KAYARAD RP-1040 | 15.05 | 15.05 | 15.05 | 15.05 | 15.05 | 15.05 |
|  | NK ESTER A-TMMT |  |  |  |  |  |  |
|  | Hexamethoxy-methylmelamine |  |  |  |  |  |  |
| Polymerization initiator | IRGACURE OXE-01 | 3.76 | 3.76 | 3.76 | 3.76 | 3.76 | 3.76 |
|  | Compound (1) |  |  |  |  |  |  |
| Photosensitive material | Benzophenone derivative DNQ |  |  |  |  |  |  |
| Antioxidant | p-Methoxyphenol | 0.01 | 0.01 | 0.01 | 0.01 | 0.01 | 0.01 |
|  | ADEKA STAB AO-80 |  |  |  |  |  |  |

TABLE 5-continued

|  |  | Example 25 | Example 26 | Example 27 | Example 28 | Example 29 | Example 30 |
|---|---|---|---|---|---|---|---|
| Surfactant | KF-6001 | 0.04 | 0.04 | 0.04 | 0.04 | 0.04 | 0.04 |
|  | POLYFOX PF6320 |  |  |  |  |  |  |
| Solvent | PGMEA | 31.61 | 31.61 | 31.61 | 31.61 | 31.61 | 31.61 |
| Total (% by mass) |  | 100 | 100 | 100 | 100 | 100 | 100 |
| Disposition of electromagnetic wave absorbing film |  | Inside | Inside | Inside | Inside | Inside | Inside |
| Size of magnetic particles |  | 100 nm/ 100 nm | 100 nm | 100 nm/ 100 nm | 100 nm | 100 nm/ 100 nm | 100 nm |
| Film thickness |  | 30 μm | 30 μm | 30 μm | 30 μm | 30 μm | 30 μm |
| μ" at 60 GHz |  | 0.2 | 0.9 | 0 | 0 | 0 | 0 |
| μ" at 47 GHz |  | 0.54 | 0 | 0.51 | 3.5 | 0 | 0 |
| μ" at 28 GHz |  | 0 | 0 | 0.66 | 0 | 0.72 | 6.8 |
| Application conditions |  | 100° C./ 2 minutes | 100° C./ 2 minutes | 100° C./ 2 minutes | 100° C./ 2 minutes | 100° C./ 2 minutes | 100° C./ 2 minutes |
| Exposure conditions |  | 10 mJ/cm² | 10 mJ/cm² | 10 mJ/cm² | 10 mJ/cm² | 10 mJ/cm² | 10 mJ/cm² |
| Development conditions |  | 60 seconds | 60 seconds | 60 seconds | 60 seconds | 60 seconds | 60 seconds |
| Baking conditions |  | 220° C./ 5 minutes | 220° C./ 5 minutes | 220° C./ 5 minutes | 220° C./ 5 minutes | 220° C./ 5 minutes | 220° C./ 5 minutes |

TABLE 6

|  |  | Comparative Example 1 | Comparative Example 2 | Comparative Example 3 |
|---|---|---|---|---|
| Magnetic particles | Barium ferrite-1 |  |  |  |
|  | Barium ferrite-2 |  |  |  |
|  | Barium ferrite-3 |  |  |  |
|  | Strontium ferrite |  |  |  |
|  | Rare earth-iron-nitrogen-based magnetic material |  |  |  |
|  | Yttrium-containing ferrite |  |  |  |
|  | Epsilon type iron oxide |  |  |  |
|  | Fe—Mn-based ferrite |  |  |  |
|  | Ni—Fe-based magnetic material |  |  |  |
|  | Nickel-zinc ferrite |  |  | 39.23 |
| Dispersing agent | X-1 | 7.06 | — | 7.06 |
|  | X-2 |  |  |  |
| Resin | B-1 | 3.24 | — | 3.24 |
|  | B-2 |  |  |  |
|  | B-3 |  |  |  |
| Polymerizable compound | KAYARAD DPHA | 15.05 | — |  |
|  | KAYARAD RP-1040 |  |  | 15.05 |
|  | NK ESTER A-TMMT |  |  |  |
|  | Hexamethoxymethylmelamine |  |  |  |
| Polymerization initiator | IRGACURE OXE-01 | 3.76 | — | 3.76 |
|  | Compound (1) |  |  |  |
| Photosensitive | Benzophenone derivative DNQ |  |  |  |
| Antioxidant | p-Methoxyphenol | 0.01 | — | 0.01 |
|  | ADEKA STAB AO-80 |  |  |  |
| Surfactant | KF-6001 | 0.04 | — | 0.04 |
|  | POLYFOX PF6320 |  |  |  |
| Solvent | PGMEA | 31.61 | — | 31.61 |
| Total (% by mass) |  | 60.77 | 0 | 100 |
| Disposition of electromagnetic wave absorbing film |  | None | Outside | Inside |
| Size of magnetic particles |  | None | — | 100 nm |
| Film thickness |  | None | 30 μm | 30 μm |
| μ" at 60 GHz |  | 0 | 0 | 0 |
| μ" at 47 GHz |  | 0 | 0 | 0 |
| μ" at 28 GHz |  | 0 | 0 | 0 |
| Application conditions |  | 100° C./2 minutes | — | 100° C./2 minutes |
| Exposure conditions |  | — | — | 10 mJ/cm² |
| Development conditions |  | — | — | 60 seconds |
| Baking conditions |  | 220° C./5 minutes | — | 220° C./5 minutes |

TABLE 7

|  | Example 1 | Example 2 | Example 3 | Example 4 | Example 5 | Example 6 |
|---|---|---|---|---|---|---|
| Adjacent disposition of electromagnetic wave absorbing film | Possible to be disposed | Possible to be disposed | Possible to be disposed | Possible to be disposed | Possible to be disposed | Possible to be disposed |
| Frequency | 60 GHz | 60 GHz | 60 GHz | 60 GHz | 60 GHz | 60 GHz |
| Electric field attenuation (dB)/(volume of electromagnetic wave absorbing film) | A | A | A | A | A | A |
| Magnetic field attenuation (dB)/(volume of electromagnetic wave absorbing film) | A | A | A | A | A | A |
| Number of layers of electromagnetic wave absorbing film | 1 | 1 | 1 | 1 | 1 | 1 |

TABLE 8

|  | Example 7 | Example 8 | Example 9 | Example 10 | Example 11 | Example 12 |
|---|---|---|---|---|---|---|
| Adjacent disposition of electromagnetic wave absorbing film | Possible to be disposed | Possible to be disposed | Possible to be disposed | Possible to be disposed | Possible to be disposed | Possible to be disposed |
| Frequency | 60 GHz | 60 GHz | 60 GHz | 60 GHz | 60 GHz | 60 GHz |
| Electric field attenuation (dB)/(volume of electromagnetic wave absorbing film) | A | A | A | C | C | B |
| Magnetic field attenuation (dB)/(volume of electromagnetic wave absorbing film) | A | A | A | C | C | B |
| Number of layers of electromagnetic wave absorbing film | 1 | 1 | 1 | 1 | 1 | 1 |

TABLE 9

|  | Example 13 | Example 14 | Example 15 | Example 16 | Example 17 | Example 18 |
|---|---|---|---|---|---|---|
| Adjacent disposition of electromagnetic wave absorbing film | Possible to be disposed | Possible to be disposed | Possible to be disposed | Possible to be disposed | Possible to be disposed | Possible to be disposed |
| Frequency | 60 GHz | 60 GHz | 60 GHz | 60 GHz | 60 GHz | 60 GHz |
| Electric field attenuation (dB)/(volume of electromagnetic wave absorbing film) | B | C | C | B | B | C |
| Magnetic field attenuation (dB)/(volume of electromagnetic wave absorbing film) | B | B | B | B | B | C |
| Number of layers of electromagnetic wave absorbing film | 1 | 1 | 1 | 1 | 1 | 2 |

TABLE 10

|  | Example 19 | Example 20 | Example 21 | Example 22 | Example 23 | Example 24 |
|---|---|---|---|---|---|---|
| Adjacent disposition of electromagnetic wave absorbing film | Possible to be disposed | Possible to be disposed | Possible to be disposed | Possible to be disposed | Possible to be disposed | Possible to be disposed |
| Frequency | 60 GHz | 60 GHz | 47 GHz | 28 GHz | 28 GHz | 28 GHz |
| Electric field attenuation (dB)/(volume of electromagnetic wave absorbing film) | C | C | A | A | A | B |
| Magnetic field attenuation (dB)/(volume of electromagnetic wave absorbing film) | C | C | A | A | A | B |
| Number of layers of electromagnetic wave absorbing film | 2 | 2 | 1 | 1 | 1 | 1 |

TABLE 11

|  | Example 25 | Example 26 | Example 27 | Example 28 | Example 29 | Example 30 |
|---|---|---|---|---|---|---|
| Adjacent disposition of electromagnetic wave absorbing film | Possible to be disposed | Possible to be disposed | Possible to be disposed | Possible to be disposed | Possible to be disposed | Possible to be disposed |
| Frequency | 60 GHz | 60 GHz | 47 GHz | 47 GHz | 28 GHz | 28 GHz |
| Electric field attenuation (dB)/(volume of electromagnetic wave absorbing film) | A | A | A | A | A | A |
| Magnetic field attenuation (dB)/(volume of electromagnetic wave absorbing film) | A | A | A | A | A | A |
| Number of layers of electromagnetic wave absorbing film | 1 | 1 | 1 | 1 | 1 | 1 |

TABLE 12

|  | Comparative Example 1 | Comparative Example 2 | Comparative Example 3 |
|---|---|---|---|
| Adjacent disposition of electromagnetic wave absorbing film | Not possible to be disposed | Possible to be disposed | Possible to be disposed |
| Frequency | 60 GHz | 60 GHz | 60 GHz |
| Electric field attenuation (dB)/(volume of electromagnetic wave absorbing film) | D | D | D |
| Magnetic field attenuation (dB)/(volume of electromagnetic wave absorbing film) | D | B | D |
| Number of layers of electromagnetic wave absorbing film | 1 | 3 | 1 |

As shown in Tables 7 to 12, in Examples 1 to 30, the electromagnetic wave absorbing film could be disposed around the passive element or the like, as compared with Comparative Examples 1 to 3. In addition, sufficient shielding performance against an electric field and a magnetic field was obtained.

EXPLANATION OF REFERENCES 10, 10a, 10b, 10c, 10d, 10e, 100: structure
11: passive element
12, 14: inductor
12a, 14a: strip-shaped member
13, 15, 102a: opening portion
20: substrate
22a: surface
21: region
22: interlayer insulating film
23: composition layer
24: electromagnetic wave absorbing film
30: photo mask
31a: mask portion
31b: region
51, 52, 53, 54, 55, 56: curve
60: antenna-in-package
61: array antenna
62: A/D circuit
63: memory
64: ASIC
65: antenna
102: copper layer

What is claimed is:
1. A structure comprising:
a substrate;
a plurality of passive elements disposed on the substrate; and
an electromagnetic wave absorbing film positioned at least in a region on the substrate between the passive elements facing each other among the plurality of passive elements disposed on the substrate,
wherein the passive element is selected from the group consisting of an inductor and a balun,
the electromagnetic wave absorbing film contains magnetic particles, and
in a case where a real part of a complex relative magnetic permeability μ of the electromagnetic wave absorbing film is defined as μ' and a complex part of the complex relative magnetic permeability μ of the electromagnetic wave absorbing film is defined as μ", the complex part μ" of the complex relative magnetic permeability μ of the electromagnetic wave absorbing film satisfies any one of requirements 1 to 3,
the requirement 1: μ" at a frequency of 28 GHz is 0.1 to 10
the requirement 2: μ" at a frequency of 47 GHz is 0.1 to 5
the requirement 3: μ" at a frequency of 60 GHz is 0.1 to 2.
2. The structure according to claim 1,
wherein the magnetic particles contain at least one metal element of Ni, Co, or Fe and have an average primary particle diameter of 20 to 1,000 nm.
3. The structure according to claim 1,
wherein the electromagnetic wave absorbing film has a thickness of 300 μm or less.
4. A composition for forming an electromagnetic wave absorbing film in the structure according to claim 1, the composition comprising:
magnetic particles;
a resin having an acid group;
a curable compound; and
a polymerization initiator, wherein, in a case where a real part of a complex relative magnetic permeability μ of an electromagnetic wave absorbing film formed of the composition is defined as μ' and a complex part of the complex relative magnetic permeability μ of the electromagnetic wave absorbing film is defined as μ", the complex part μ" of the complex relative magnetic permeability μ of the electromagnetic wave absorbing film satisfies any one of requirements 1 to 3, the requirement 1: μ" at a frequency of 28 GHz is 0.1 to 10 the requirement 2: μ" at a frequency of 47 GHz is 0.1 to 5 the requirement 3: μ" at a frequency of 60 GHz is 0.1 to 2.

5. The composition according to claim 4,
wherein the magnetic particles contain at least one metal element of Ni, Co, or Fe and have an average primary particle diameter of 20 to 1,000 nm.

6. A structure comprising:
a substrate;
a plurality of coiled passive elements disposed on the substrate and having opening portions that open to a surface of the substrate; and
an electromagnetic wave absorbing film positioned in at least one opening portion among the opening portions of the plurality of coiled passive elements disposed on the substrate,
wherein the coiled passive element is selected from the group consisting of an inductor and a balun,
the electromagnetic wave absorbing film contains magnetic particles, and
in a case where a real part of a complex relative magnetic permeability μ of the electromagnetic wave absorbing film is defined as μ' and a complex part of the complex relative magnetic permeability μ of the electromagnetic wave absorbing film is defined as μ", the complex part μ" of the complex relative magnetic permeability μ of the electromagnetic wave absorbing film satisfies any one of requirements 1 to 3, the requirement 1: μ" at a frequency of 28 GHz is 0.1 to 10 the requirement 2: μ" at a frequency of 47 GHz is 0.1 to 5 the requirement 3: μ" at a frequency of 60 GHz is 0.1 to 2.

7. The structure according to claim 6,
wherein the electromagnetic wave absorbing film is provided in a region on the substrate between the plurality of coiled passive elements disposed on the substrate.

8. The structure according to claim 6,
wherein the magnetic particles contain at least one metal element of Ni, Co, or Fe and have an average primary particle diameter of 20 to 1,000 nm.

9. The structure according to claim 6,
wherein the electromagnetic wave absorbing film has a thickness of 300 μm or less.

10. A composition for forming an electromagnetic wave absorbing film in the structure according to claim 6, the composition comprising:
magnetic particles;
a resin having an acid group;
a curable compound; and
a polymerization initiator,
wherein, in a case where a real part of a complex relative magnetic permeability μ of an electromagnetic wave absorbing film formed of the composition is defined as μ' and a complex part of the complex relative magnetic permeability μ of the electromagnetic wave absorbing film is defined as μ", the complex part μ" of the complex relative magnetic permeability μ of the electromagnetic wave absorbing film satisfies any one of requirements 1 to 3, the requirement 1: μ" at a frequency of 28 GHz is 0.1 to 10 the requirement 2: μ" at a frequency of 47 GHz is 0.1 to 5 the requirement 3: μ" at a frequency of 60 GHz is 0.1 to 2.

11. A structure comprising:
a substrate;
a plurality of passive elements disposed on the substrate; and
an electromagnetic wave absorbing film provided at least one of between the substrate and the passive element or on an opposite side of the substrate of the passive element,
wherein the passive element is selected from the group consisting of an inductor and a balun,
the electromagnetic wave absorbing film contains magnetic particles, and
in a case where a real part of a complex relative magnetic permeability μ of the electromagnetic wave absorbing film is defined as μ' and a complex part of the complex relative magnetic permeability μ of the electromagnetic wave absorbing film is defined as μ", the complex part μ" of the complex relative magnetic permeability μ of the electromagnetic wave absorbing film satisfies any one of requirements 1 to 3, the requirement 1: μ" at a frequency of 28 GHz is 0.1 to 10 the requirement 2: μ" at a frequency of 47 GHz is 0.1 to 5 the requirement 3: μ" at a frequency of 60 GHz is 0.1 to 2.

12. The structure according to claim 11,
wherein the electromagnetic wave absorbing film is provided between the substrate and the passive element and on the opposite side of the substrate of the passive element.

13. The structure according to claim 11,
wherein the magnetic particles contain at least one metal element of Ni, Co, or Fe and have an average primary particle diameter of 20 to 1,000 nm.

14. The structure according to claim 11,
wherein the electromagnetic wave absorbing film has a thickness of 300 μm or less.

15. A method for manufacturing a structure, comprising:
a step of forming a composition layer by applying a photosensitive composition containing magnetic particles onto a substrate on which a plurality of passive elements are disposed; and
a step of subjecting the composition layer to an exposure treatment and a development treatment to form an electromagnetic wave absorbing film positioned at least in a region between the passive elements facing each other among the plurality of passive elements disposed on the substrate,
wherein the passive element is selected from the group consisting of an inductor and a balun, and
in a case where a real part of a complex relative magnetic permeability μ of the electromagnetic wave absorbing film is defined as μ' and a complex part of the complex relative magnetic permeability μ of the electromagnetic wave absorbing film is defined as $\mu''$, the complex part $\mu''$ of the complex relative magnetic permeability $\mu$ of the electromagnetic wave absorbing film satisfies any one of requirements 1 to 3, the requirement 1: $\mu''$ at a frequency of 28 GHz is 0.1 to 10 the requirement 2: $\mu''$ at a frequency of 47 GHz is 0.1 to 5 the requirement 3: $\mu''$ at a frequency of 60 GHz is 0.1 to 2.

16. A method for manufacturing a structure, comprising:

a step of forming a composition layer by applying a photosensitive composition containing magnetic particles onto at least one opening portion of a plurality of coiled passive elements disposed on a substrate and having opening portions that open to a surface of the substrate; and a step of subjecting the composition layer to an exposure treatment and a development treatment to form an electromagnetic wave absorbing film positioned in at least one opening portion among the opening portions of the plurality of coiled passive elements disposed on the substrate, wherein the coiled passive element is selected from the group consisting of an inductor and a balun, and in a case where a real part of a complex relative magnetic permeability $\mu$ of the electromagnetic wave absorbing film is defined as $\mu'$ and a complex part of the complex relative magnetic permeability $\mu$ of the electromagnetic wave absorbing film is defined as $\mu''$, the complex part $\mu''$ of the complex relative magnetic permeability $\mu$ of the electromagnetic wave absorbing film satisfies any one of requirements 1 to 3, the requirement 1: $\mu''$ at a frequency of 28 GHz is 0.1 to 10 the requirement 2: $\mu''$ at a frequency of 47 GHz is 0.1 to 5 the requirement 3: $\mu''$ at a frequency of 60 GHz is 0.1 to 2.

17. The method for manufacturing a structure according to claim 16, wherein the step of forming a composition layer includes a step of applying the photosensitive composition onto the opening portions of the plurality of coiled passive elements and the substrate on which the plurality of coiled passive elements are disposed, and the step of forming an electromagnetic wave absorbing film is a step of forming the electromagnetic wave absorbing film in the opening portions of the plurality of coiled passive elements disposed on the substrate and in a region on the substrate between the plurality of coiled passive elements.

18. A method for manufacturing a structure, comprising:

a step of forming a composition layer by applying a photosensitive composition containing magnetic particles onto a substrate;

a step of subjecting the composition layer to an exposure treatment and a development treatment to form an electromagnetic wave absorbing film on the substrate; and a step of forming a plurality of passive elements on the electromagnetic wave absorbing film, wherein the passive element is selected from the group consisting of an inductor and a balun, in a case where a real part of a complex relative magnetic permeability $\mu$ of the electromagnetic wave absorbing film is defined as $\mu'$ and a complex part of the complex relative magnetic permeability $\mu$ of the electromagnetic wave absorbing film is defined as $\mu''$, the complex part $\mu''$ of the complex relative magnetic permeability $\mu$ of the electromagnetic wave absorbing film satisfies any one of requirements 1 to 3, the requirement 1: $\mu''$ at a frequency of 28 GHz is 0.1 to 10 the requirement 2: $\mu''$ at a frequency of 47 GHz is 0.1 to 5 the requirement 3: $\mu''$ at a frequency of 60 GHz is 0.1 to 2.

19. The method for manufacturing a structure according to claim 18, further comprising:

a step of forming a composition layer by applying the photosensitive composition onto the electromagnetic wave absorbing film on which the plurality of passive elements have been formed; and a step of subjecting the composition layer to an exposure treatment and a development treatment to further form an electromagnetic wave absorbing film on the electromagnetic wave absorbing film on which the plurality of passive elements have been formed.

20. A method for manufacturing a structure, comprising:

a step of forming a composition layer by applying a photosensitive composition containing magnetic particles onto a substrate on which a plurality of passive elements are disposed; and a step of subjecting the composition layer to an exposure treatment and a development treatment to form an electromagnetic wave absorbing film on the plurality of passive elements, wherein the passive element is selected from the group consisting of an inductor and a balun, in a case where a real part of a complex relative magnetic permeability $\mu$ of the electromagnetic wave absorbing film is defined as $\mu'$ and a complex part of the complex relative magnetic permeability $\mu$ of the electromagnetic wave absorbing film is defined as $\mu''$, the complex part $\mu''$ of the complex relative magnetic permeability $\mu$ of the electromagnetic wave absorbing film satisfies any one of requirements 1 to 3, the requirement 1: $\mu''$ at a frequency of 28 GHz is 0.1 to 10 the requirement 2: $\mu''$ at a frequency of 47 GHz is 0.1 to 5 the requirement 3: $\mu''$ at a frequency of 60 GHz is 0.1 to 2.

* * * * *